US012575240B2

(12) United States Patent
Park et al.

(10) Patent No.: US 12,575,240 B2
(45) Date of Patent: Mar. 10, 2026

(54) DISPLAY DEVICE

(71) Applicant: Samsung Display Co., LTD., Yongin-si (KR)

(72) Inventors: Do Yeong Park, Yongin-si (KR); Jin Seon Kwak, Yongin-si (KR); Dong Woo Kim, Yongin-si (KR); Yeon Kyung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 396 days.

(21) Appl. No.: 18/120,025

(22) Filed: Mar. 10, 2023

(65) Prior Publication Data

US 2023/0402578 A1 Dec. 14, 2023

(30) Foreign Application Priority Data

Jun. 8, 2022 (KR) ........................ 10-2022-0069790

(51) Int. Cl.
| | |
|---|---|
| *H10H 20/857* | (2025.01) |
| *H01L 25/16* | (2023.01) |
| *H10D 86/40* | (2025.01) |
| *H10D 86/60* | (2025.01) |
| *H10H 20/831* | (2025.01) |
| *H10H 20/851* | (2025.01) |

(52) U.S. Cl.
CPC ......... *H10H 20/857* (2025.01); *H01L 25/167* (2013.01); *H10D 86/441* (2025.01); *H10D 86/60* (2025.01); *H10H 20/8312* (2025.01); *H10H 20/8514* (2025.01)

(58) Field of Classification Search
None
See application file for complete search history.

(56) References Cited

U.S. PATENT DOCUMENTS

| | | |
|---|---|---|
| 10,249,603 B2 | 4/2019 | Cho et al. |
| 10,276,630 B2 | 4/2019 | Lee et al. |
| (Continued) | | |

FOREIGN PATENT DOCUMENTS

| | | |
|---|---|---|
| CN | 106920529 | 7/2017 |
| KR | 10-2018-0009014 | 1/2018 |
| (Continued) | | |

*Primary Examiner* — Bo B Jang
(74) *Attorney, Agent, or Firm* — Womble Bond Dickinson (US) LLP

(57) ABSTRACT

A sub-pixel of a display device includes: a first transistor including a gate electrode connected to a first node, a first terminal connected to a first power line, and a second terminal connected to a second node; a light emitting part connected to the second node and a second power line and including at least one light emitting element; and a capacitor formed between the first and second nodes. The capacitor includes a first capacitor electrode, and a second capacitor electrode overlapping the first capacitor electrode with an insulating layer interposed therebetween in a plan view. The second capacitor electrode includes a first protrusion part protruding further in an extending direction than an edge of the first capacitor electrode, and a second protrusion part protruding further in a direction opposite to the extending direction from a portion of an edge of the second capacitor electrode in a plan view.

20 Claims, 20 Drawing Sheets

CE2: BODY, PRT1, PRT2

(56) References Cited

U.S. PATENT DOCUMENTS

| | | | |
|---|---|---|---|
| 10,340,419 B2 | 7/2019 | Kim et al. | |
| 10,916,612 B2 | 2/2021 | An | |
| 10,978,499 B2 | 4/2021 | Jang et al. | |
| 2018/0175009 A1* | 6/2018 | Kim | H01L 25/0753 |
| 2019/0251898 A1* | 8/2019 | Cho | H10H 20/819 |
| 2021/0111323 A1* | 4/2021 | Kim | G09G 3/325 |
| 2021/0265329 A1 | 8/2021 | Woo et al. | |
| 2021/0376045 A1 | 12/2021 | Lee et al. | |
| 2022/0102422 A1 | 3/2022 | Lee et al. | |
| 2022/0392923 A1 | 12/2022 | Oh et al. | |

FOREIGN PATENT DOCUMENTS

| | | |
|---|---|---|
| KR | 10-2018-0011404 | 2/2018 |
| KR | 10-1987196 | 6/2019 |
| KR | 10-2020-0079894 | 7/2020 |
| KR | 10-2021-0059075 | 5/2021 |
| KR | 10-2021-0107208 | 9/2021 |
| KR | 10-2021-0148539 | 12/2021 |
| KR | 10-2022-0043993 | 4/2022 |

* cited by examiner

FIG. 7B

CCL: CCL1, CCL2, CCL3
CF: CF1, CF2, CF3
QD: QDg, QDr

FIG. 7C

CCL: CCL1, CCL2, CCL3
CF: CF1, CF2, CF3
QD: QDg, QDr

CE2: BODY, PRT1, PRT2

CE2_2: BODY, PRT1, PRT2

DISPLAY DEVICE

CROSS-REFERENCE TO RELATED APPLICATION(S)

This application claims priority to and benefits of Korean patent application No. 10-2022-0069790 under 35 U.S.C. § 119(a), filed on Jun. 8, 2022, in the Korean Intellectual Property Office (KIPO), the entire contents of which are incorporated herein by reference.

BACKGROUND

1. Technical Field

The disclosure relates to a display device.

2. Description of the Related Art

As interest in information displays and demand for portable information media increase, research and commercialization has focused on display devices.

SUMMARY

Embodiments provide a display device capable of improving display quality.

In accordance with an aspect of the disclosure, a display device may include a sub-pixel. The sub-pixel may include: a first transistor including a gate electrode electrically connected to a first node, a first terminal electrically connected to a first power line, and a second terminal electrically connected to a second node; a light emitting part electrically connected to the second node and a second power line, the light emitting part including at least one light emitting element; and a capacitor formed between the first node and the second node. The capacitor may include a first capacitor electrode, and a second capacitor electrode overlapping the first capacitor electrode in a plan view. An insulating layer may be disposed between the first capacitor electrode and the second capacitor electrode. The second capacitor electrode may include a first protrusion part protruding further in an extending direction than an edge of the first capacitor electrode to receive a data signal in a plan view, and a second protrusion part protruding further in a direction opposite to the extending direction from a portion of an edge of the second capacitor electrode in a plan view.

The second capacitor electrode may overlap the first capacitor electrode except the first and second protrusion parts in a plan view.

The second protrusion part may not be directly connected to an external component.

A first width of the first protrusion part and a second width of the second protrusion part may be equal in a direction perpendicular to the extending direction.

Regardless of an alignment error between the first capacitor electrode and the second capacitor electrode, an overlapping area between the first capacitor electrode and the second capacitor electrode in a plan view may be constantly maintained by the second protrusion part corresponding to the first protrusion part.

The first protrusion part and the second protrusion part may not be collinear with each other.

The first protrusion part and the second protrusion part may be collinear with each other.

The second capacitor electrode may further include a body part which overlaps the first capacitor electrode in a plan view. A width of the body part may be greater than a width of the second protrusion part in a direction perpendicular to the extending direction. The second protrusion part may protrude by about 3 μm in the opposite direction from the body part.

The first capacitor electrode may be located under a semiconductor pattern of the first transistor in a cross-sectional view. A first insulating layer may be disposed between the first capacitor electrode and the semiconductor pattern. The second capacitor electrode may be disposed on the semiconductor pattern in a cross-sectional view. A second insulating layer may be disposed between the second capacitor electrode and the semiconductor pattern.

The capacitor may further include a third capacitor electrode overlapping the second capacitor electrode in a plan view. A third insulating layer may be disposed between the third capacitor electrode and the second capacitor electrode.

The third capacitor electrode may be electrically connected to the first capacitor electrode through a contact hole penetrating the first, second, and third insulating layers.

The second capacitor electrode may be disposed on a semiconductor pattern of the first transistor. The first capacitor electrode may be disposed on the second capacitor electrode. The insulating layer may be disposed between the first capacitor electrode and the second capacitor electrode.

The sub-pixel may further include a second transistor electrically connected between a data line and the first node. The first protrusion part may protrude toward the second transistor in a plan view.

The data line may extend in the extending direction.

The data line may extend in a direction intersecting the extending direction.

The light emitting part may further include a first electrode and a second electrode, spaced apart from each other, a first pixel electrode disposed on the first electrode, the first pixel electrode being electrically connected to an end of the at least one light emitting element, and a second pixel electrode disposed on the second electrode, the second pixel electrode being electrically connected to another end of the at least one light emitting element. The at least one light emitting element may be disposed between the first electrode and the second electrode.

The first pixel electrode may be electrically connected to the second terminal of the first transistor through a contact hole penetrating another insulating layer disposed below the first and second electrodes.

The sub-pixel may further include a color conversion layer disposed on the at least one light emitting element, the color conversion layer converting a wavelength of light incident from the at least one light emitting element and releasing the light having the converted wavelength.

The first power line may include a first vertical power line extending in a first direction and a second vertical power line extending in a second direction. Pixel circuits of a plurality of sub-pixels constituting one pixel may be disposed in an area partitioned by the first vertical power line, the second vertical power line, and the second power line in a plan view. Each of the pixel circuits may include the first transistor and the capacitor.

The pixel circuits in the area may be arranged in the first direction. Data lines for the sub-pixels may extend in the first direction and be disposed adjacent to each other.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure.

FIG. 7B is a schematic cross-sectional view illustrating the pixel in the display device shown FIG. 3 in accordance with an embodiment of the disclosure.

FIG. 7C is a schematic cross-sectional view illustrating the pixel in the display device shown FIG. 3 in accordance with an embodiment of the disclosure.

DETAILED DESCRIPTION OF THE EMBODIMENTS

Figure 1:
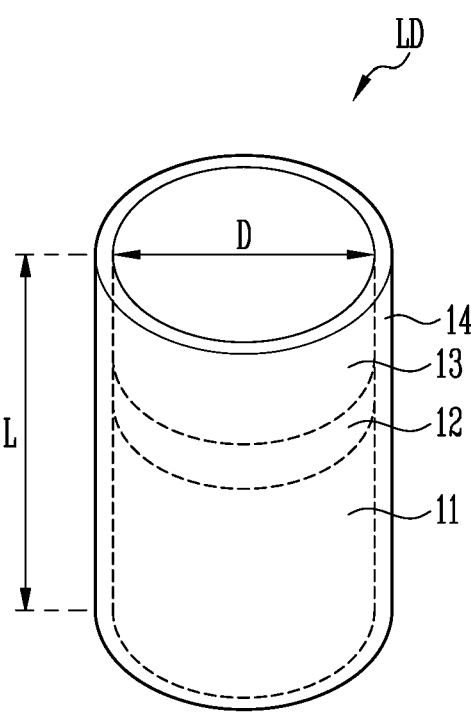
FIG. 1 is a perspective view illustrating a light emitting element in accordance with an embodiment of the disclosure.

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

The disclosure may apply various changes and different shape, therefore only illustrate in details with particular embodiments. However, the embodiments do not limit to certain shapes but apply to all the change and equivalent material and replacement. The drawings included are illustrated a fashion where the figures are expanded for the better understanding.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The effects and characteristics of the present disclosure and a method of achieving the effects and characteristics will be clear by referring to the embodiments described below in detail together with the accompanying drawings. However, the present disclosure is not limited to the embodiments disclosed herein but may be implemented in various forms.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a display device in accordance with an embodiment of the disclosure will be described with reference to the accompanying drawings.

Figure 2:
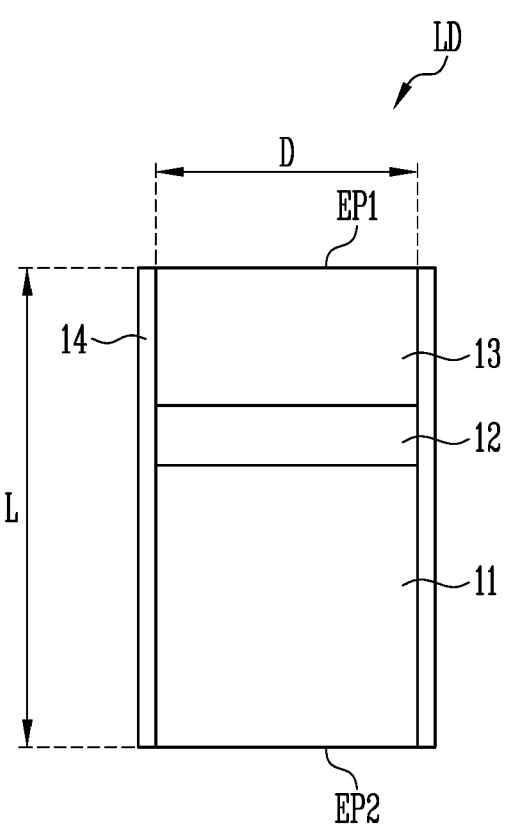
FIG. 2 is a schematic cross-sectional view illustrating the light emitting element in accordance with the embodiment of the disclosure.

FIG. 1 is a perspective view illustrating a light emitting element in accordance with an embodiment of the disclosure. FIG. 2 is a schematic cross-sectional view illustrating the light emitting element in accordance with the embodiment of the disclosure. Although a pillar-shaped light emitting element LD is illustrated in FIGS. 1 and 2, the kind and/or shape of the light emitting element LD is not limited thereto.

Referring to FIGS. 1 and 2, the light emitting element LD may include a first semiconductor layer 11, an active layer 12, and a second semiconductor layer 13. In case that an extending direction of the light emitting element LD is a length L direction, the first semiconductor layer 11, the active layer 12, and the second semiconductor layer 13 may be sequentially stacked in the length L direction.

The light emitting element LD may be provided in a pillar shape extending in a direction. The light emitting element LD may have a first end portion EP1 and a second end portion EP2. One of the first and second semiconductor layers 11 and 13 may be disposed at the first end portion EP1 of the light emitting element LD. Another one of the first and second semiconductor layers 11 and 13 may be disposed at the second end portion EP2 of the light emitting element LD.

In some embodiments, the light emitting element LD may be a light emitting element manufactured in a pillar shape through an etching process, or the like. In this specification, the term "pillar shape" may include a rod-like shape or bar-like shape, which is long in the length L direction (i.e., its aspect ratio is greater than 1), such as a cylinder or a polyprism, and the cross-sectional shape is not particularly limited. For example, a length L of the light emitting element LD may be greater than a diameter D (or a width in a cross-sectional view) of the light emitting element LD.

The light emitting element LD may have a size of nanometer scale to micrometer scale. In an embodiment, the light emitting element LD may have a diameter D (or width) in a range of nanometer scale to micrometer scale and/or a length L in a range of nanometer scale to micrometer scale. However, the size of the light emitting element LD is not limited thereto, and the size of the light emitting element LD may be variously changed according to design conditions of various types of devices, e.g., a display device, and the like, which use, as a light source, a light emitting device using the light emitting element LD.

The first semiconductor layer 11 may be a first conductivity type semiconductor layer. For example, the first semiconductor layer 11 may include an n-type semiconductor layer. In an embodiment, the first semiconductor layer 11 may include at least one semiconductor material such as InAlGaN, GaN, AlGaN, InGaN, AlN, and InN, and include an n-type semiconductor layer doped with a first conductivity type dopant such as Si, Ge, and Sn. However, the material constituting the first semiconductor layer 11 is not limited thereto. The first semiconductor layer 11 may be formed of various materials.

The active layer 12 may be formed on the first semiconductor layer 11, and may be formed in a single-quantum well structure or a multi-quantum well structure. The active layer 12 may include GaN, InGaN, InAlGaN, AlGaN, AlN or the like. The active layer 12 may be formed of various materials. In some embodiments, a clad layer (not shown) doped with a conductive dopant may be formed on the top and/or the bottom of the active layer 12. In an embodiment, the clad layer may include an AlGaN layer or InAlGaN layer.

The second semiconductor layer 13 may be formed on the active layer 12, and may include a semiconductor layer having a type different from that of the first semiconductor layer 11. For example, the second semiconductor layer 13 may include a p-type semiconductor layer. In an embodiment, the second semiconductor layer 13 may include at least one semiconductor material such as InAlGaN, GaN, AlGaN, InGaN, AlN, and InN, and include a p-type semiconductor layer doped with a second conductivity type dopant such as Mg. However, the material constituting the second semiconductor layer 13 is not limited thereto. The second semiconductor layer 13 may be formed of various materials.

In case that a voltage of a threshold voltage or more is applied to both ends of the light emitting element LD, the light emitting element LD may emit light as electron-hole pairs are combined in the active layer 12. The light emission of the light emitting element LD may be controlled by using such a principle, so that the light emitting element LD can be used as a light source for various light emitting devices, including a pixel of a display device.

The light emitting element LD may further include an insulative film 14 provided on a surface thereof. The insulative film 14 may be formed on the surface of the light emitting element LD to surround an outer circumferential surface of at least the active layer 12. The insulative film 14 may further surround at least a portion of circumferential surfaces of each of the first and second semiconductor layers 11 and 13.

In some embodiments, the insulative film 14 may expose both end portions EP1 and EP2 of the light emitting element LD, which have different polarities. For example, the insulative film 14 may expose an end of each of the first and second semiconductor layers 11 and 13 located at the first and second end portions EP1 and EP2 of the light emitting element LD. In another embodiment, the insulative film 14 may expose a side portion of each of the first and second semiconductor layers 11 and 13 adjacent to the first and second end portions EP1 and EP2 of the light emitting element LD, which have different polarities.

In some embodiments, the insulative film 14 may be configured as a single layer or a multi-layer (e.g., a double layer formed of aluminum oxide ($AlO_x$) and silicon oxide ($SiO_x$)), including at least one insulating material such as silicon oxide (SiO$_x$), silicon nitride (SiN$_x$), silicon oxynitride (SiO$_x$N$_y$), aluminum oxide (AlO$_x$), and titanium oxide (TiO$_x$), but the disclosure is not limited thereto. For example, in accordance with another embodiment, the insulative film 14 may be omitted.

In case that the insulative film 14 is provided to cover the surface of the light emitting element LD, for example, the outer circumferential surface of the active layer 12, the active layer 12 may be prevented from being short-circuited with a first pixel electrode, a second pixel electrode, or the like, which will be described later. Accordingly, the electrical stability of the light emitting element LD may be ensured.

Also, in case that the insulative film 14 is provided on the surface of the light emitting element LD, a surface defect of the light emitting element LD may be minimized, thereby improving the lifetime and efficiency of the light emitting element LD. Even in case that multiple light emitting elements LD are densely disposed, an unwanted short circuit may be prevented from occurring between the light emitting elements LD.

In an embodiment, the light emitting element LD may further include an additional component in addition to the first semiconductor layer 11, the active layer 12, the second semiconductor layer 13, and/or the insulative film 14 surrounding the same. For example, the light emitting element LD may include at least one phosphor layer, at least one active layer, at least one semiconductor layer, and/or at least one electrode layer, which are disposed at one ends of the first semiconductor layer 11, the active layer 12, and/or the second semiconductor layer 13.

Although the pillar-shaped light emitting element LD has been illustrated in FIGS. 1 and 2, the kind, structure, and/or shape of the light emitting element LD may be variously changed. For example, the light emitting element LD may be formed in a core-shell structure having a polypyramid shape.

A light emitting device including the above-described light emitting element LD may be used in various kinds of devices which require a light source, including a display device. For example, multiple light emitting elements LD may be disposed in each pixel of a display panel, and may be used as a light source of each pixel. However, the application field of the light emitting element LD is not limited to the above-described example. For example, the light emitting element LD may be used in other types of devices that require a light source, such as a lighting device.

Figure 3:
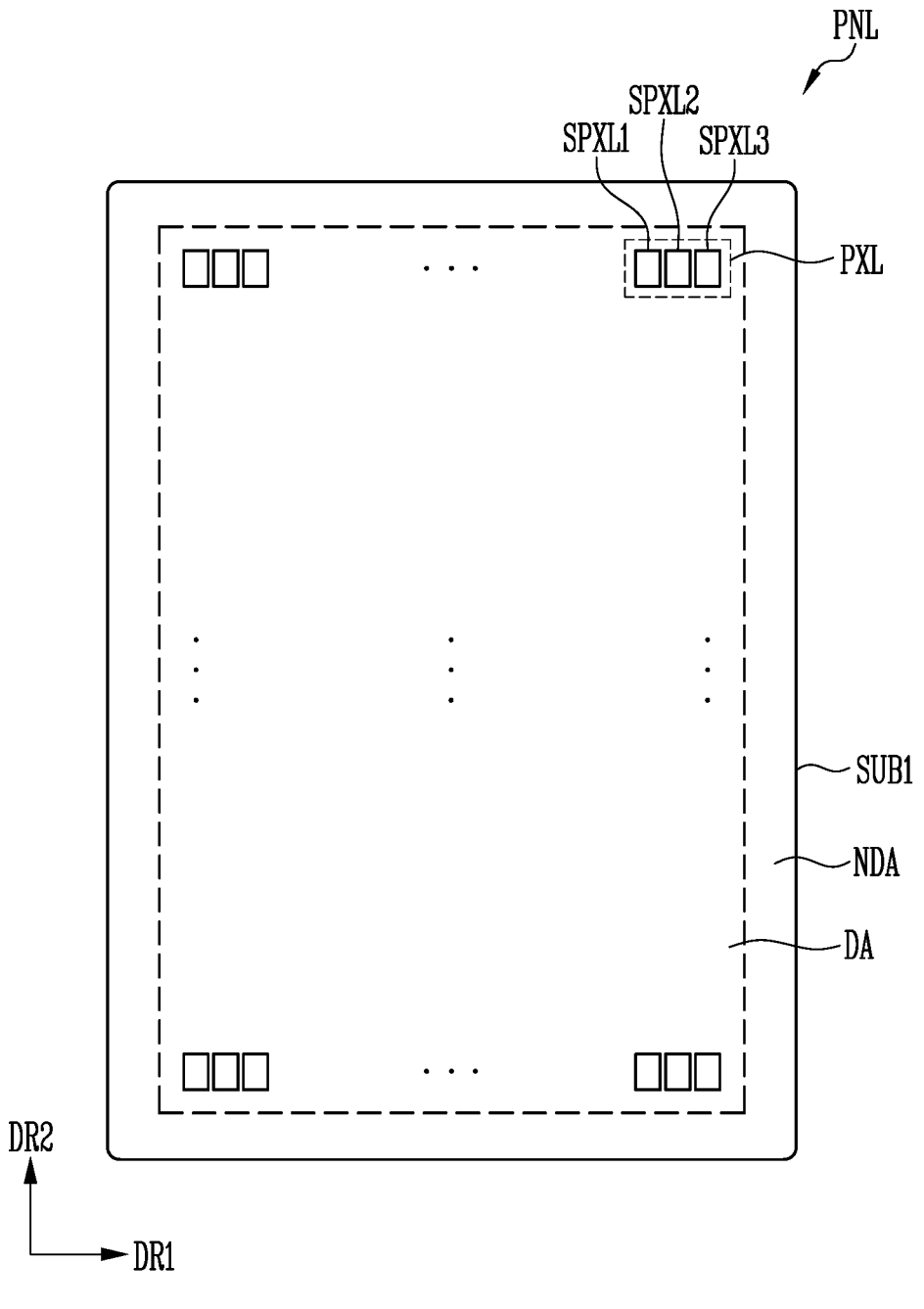
FIG. 3 is a plan view illustrating a display device in accordance with an embodiment of the disclosure.

FIG. 3 is a plan view illustrating a display device in accordance with an embodiment of the disclosure. In FIG. 3, a display panel PNL provided in the display device will be illustrated as an example of an electronic device which can use, as a light source, the light emitting element LD described in the embodiment shown in FIGS. 1 and 2.

For convenience of description, in FIG. 3, a structure of the display panel PNL will be briefly illustrated based on a display area DA. In some embodiments, at least one driving circuit (e.g., at least one of a scan driver and a data driver), lines, and/or pads may be disposed in the display panel PNL.

The disclosure may be applied as long as the display device is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

Referring to FIG. 3, the display panel PNL may include a first substrate SUB1 and pixels PXL disposed on the first substrate SUB1.

The first substrate SUB1 (or base layer) may constitute a base member of the display panel PNL, and may be a rigid or flexible substrate or film. In an embodiment, the first substrate SUB1 may be configured as a rigid substrate made of glass or tempered glass, a flexible substrate (or thin film) made of plastic or metal, or at least one insulating layer. The material and/or property of the first substrate SUB1 is not particularly limited.

In an embodiment, the first substrate SUB1 may be substantially transparent. The term "substantially transparent" may mean that light can be transmitted with a predetermined (or selectable) transmittance or more. In another embodiment, the first substrate SUB1 may be translucent or opaque. In some embodiments, the first substrate SUB1 may include a reflective material.

The display panel PNL and the first substrate SUB1 may include the display area DA for displaying an image and a non-display area NDA other than the display area DA.

The pixels PXL may be arranged in the display area DA. Various lines, pads, and/or a built-in circuit, which are connected to the pixels PXL of the display area DA, may be disposed in the non-display area NDA.

The pixel PXL may include sub-pixels SPXL1 to SPXL3. For example, the pixel PXL may include a first sub-pixel SPXL1, a second sub-pixel SPXL2, and a third sub-pixel SPXL3.

Each of the sub-pixels SPXL1 to SPXL3 may emit light of a predetermined (or selectable) color. In some embodiments, the sub-pixels SPXL1 to SPXL3 may emit lights of different colors. In an embodiment, the first sub-pixel SPXL1 may emit light of a first color, the second sub-pixel SPXL2 may emit light of a second color, and the third sub-pixel SPXL3 may emit light of a third color. For example, the first sub-pixel SPXL1 may be a red pixel emitting light of red, the second sub-pixel SPXL2 may be a green pixel emitting light of green, and the third sub-pixel SPXL3 may be a blue pixel emitting light of blue. However, the disclosure is not limited thereto.

In an embodiment, the first sub-pixel SPXL1, the second sub-pixel SPXL2, and the third sub-pixel SPXL3 may have, as light sources, a light emitting element of the first color, a light emitting element of the second color, and a light emitting element of the third color, to emit lights of the first color, the second color, and the third color, respectively. In another embodiment, the first sub-pixel SPXL1, the second sub-pixel SPXL2, and the third sub-pixel SPXL3 may have light emitting elements emitting light of the same color and include color conversion layers and/or color filters of different colors, which are disposed above the respective light emitting elements, to respectively emit lights of the first color, the second color, and the third color. However, the color, kind, and/or number of sub-pixels SPXL1 to SPXL3 constituting each pixel PXL are not particularly limited. For example, the color of light emitted by each pixel PXL may be variously changed.

The sub-pixels SPXL1 to SPXL3 may be regularly arranged in a stripe structure, a PENTILE™ structure, or the like. For example, the first, second, and third sub-pixels SPXL1, SPXL2, and SPXL3 may be sequentially and repeatedly disposed in a first direction DR1. Also, the first, second, and third sub-pixels SPXL1, SPXL2, and SPXL3 may be repeatedly disposed in a second direction DR2. At least one first sub-pixel SPXL1, at least one second sub-pixel SPXL2, and at least one third sub-pixel SPXL3 may constitute one pixel PXL capable of emitting lights of various colors. However, the arrangement structure of the sub-pixels SPXL1 to SPXL3 is not limited thereto, and the sub-pixels SPXL1 to SPXL3 may be arranged in the display area DA in various structures and/or various patterns.

In an embodiment, each of the sub-pixels SPXL1 to SPXL3 may be configured as an active pixel. For example, each of the sub-pixels SPXL1 to SPXL3 may include at least one light source (e.g., at least one light emitting element) driven by a predetermined (or selectable) control signal (e.g., a scan signal and a data signal) and/or a predetermined (or selectable) power source (e.g., a first power source and a second power source). However, the kind, structure, and/or driving method of the sub-pixels SPXL1 to SPXL3, which can be applied to the display device, are not particularly limited.

Figure 4A:
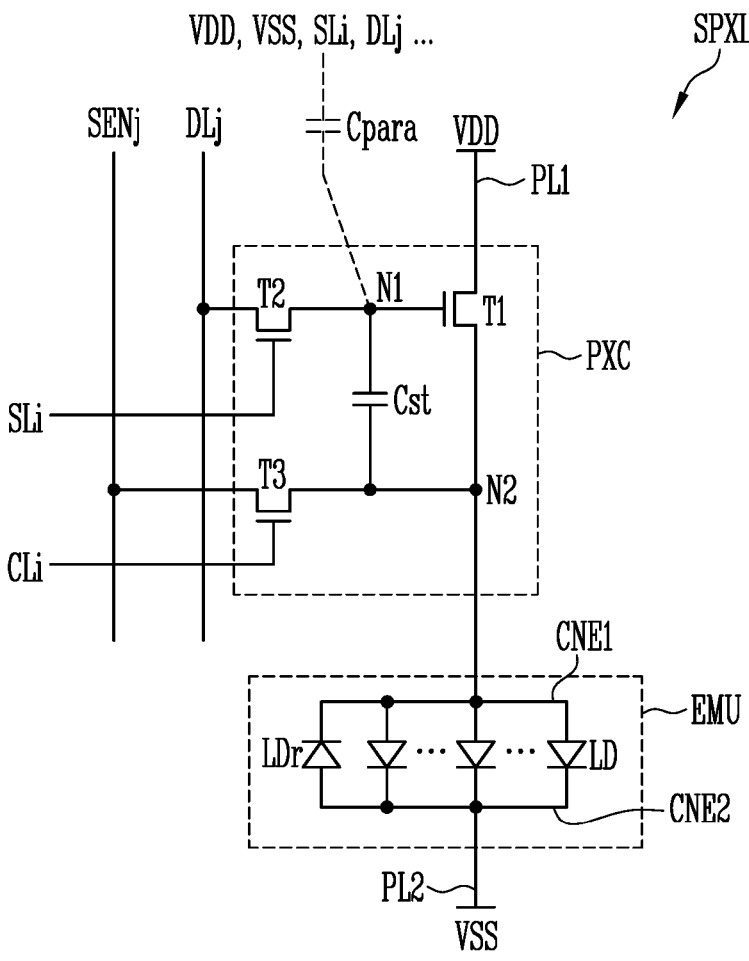
FIG. 4A is a schematic diagram of an equivalent circuit of a pixel in the display device shown in FIG. 3 in accordance with an embodiment of the disclosure.
Figure 4B:
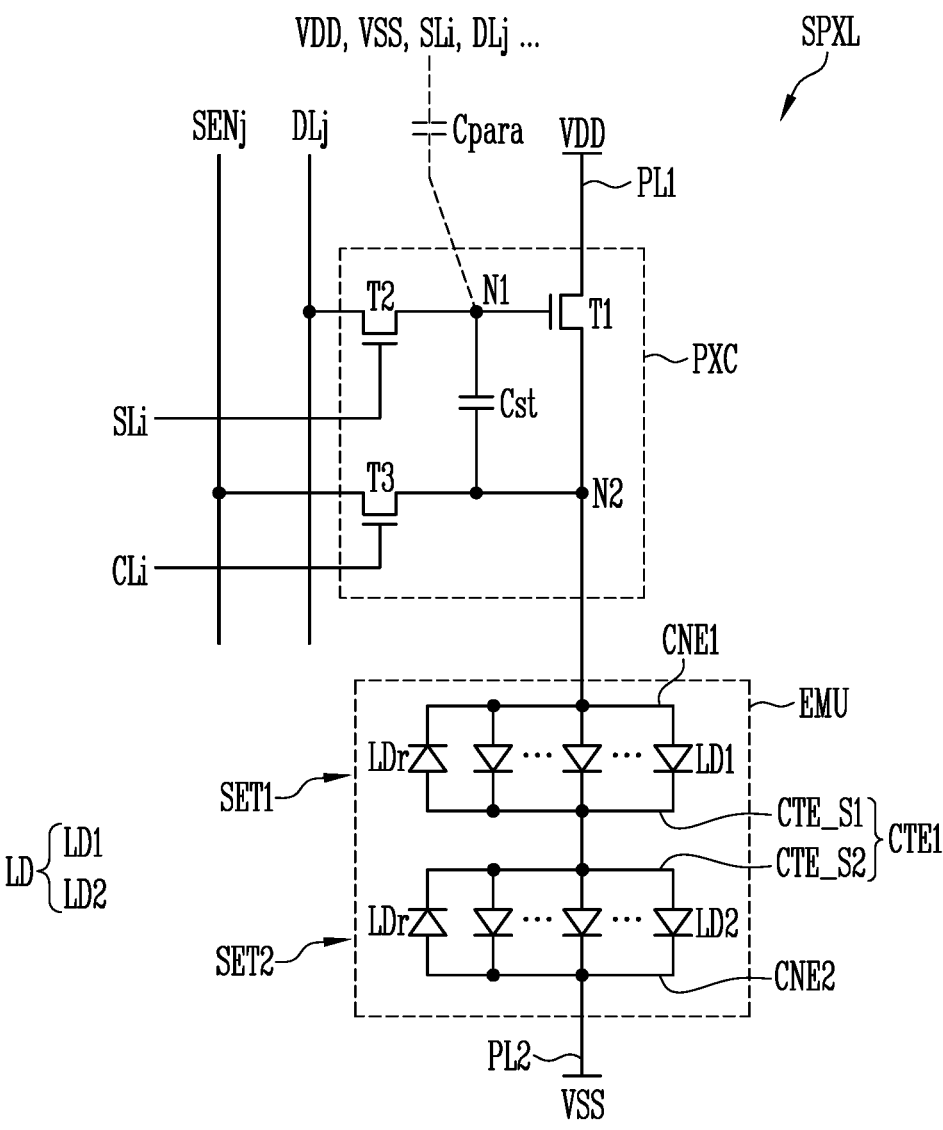
FIG. 4B is a schematic diagram of an equivalent circuit of a pixel in the display device shown in FIG. 3 in accordance with an embodiment of the disclosure.
Figure 4C:
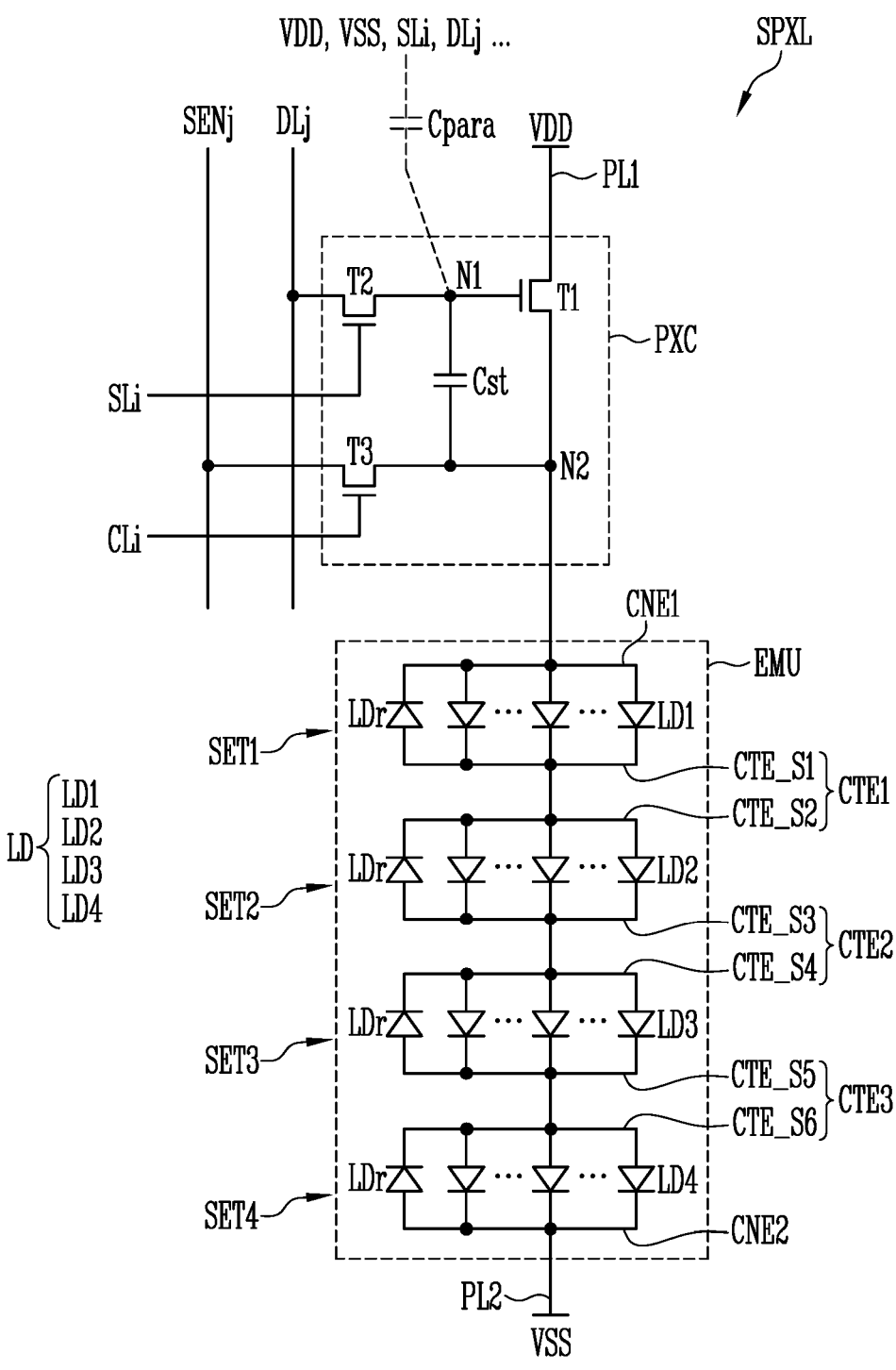
FIG. 4C is a schematic diagram of an equivalent circuit of a pixel in the display device shown in FIG. 3 in accordance with an embodiment of the disclosure.

FIGS. 4A, 4B, and 4C each are schematic diagram of an equivalent circuit of the pixel in the display device shown in FIG. 3 in accordance with an embodiment of the disclosure.

For example, FIGS. 4A, 4B, and 4C illustrate embodiments of an electrical connection relationship of components included in each of sub-pixels SPXL1 to SPXL3 applicable to an active matrix type display device. However, the connection relationship of the components included in each of the sub-pixels SPXL1 to SPXL3 is not limited thereto. In the following embodiments, a first sub-pixel SPXL1, a second sub-pixel SPXL2, and a third sub-pixel SPXL3 may be inclusively referred to as a sub-pixel SPXL.

Referring to FIGS. 3, 4A, 4B, and 4C, the sub-pixel SPXL may include a light emitting unit EMU (or light emitting part) which generates light with a luminance corresponding to a data signal. The sub-pixel SPXL may selectively include a pixel circuit PXC for driving the light emitting unit EMU.

In some embodiments, the light emitting unit EMU may include multiple light emitting elements LD connected in parallel between a first power line PL1 and a second power line PL2. The first power line PL1 may be connected to a first driving power source VDD such that a voltage of the first driving power source VDD is applied thereto, and the second power line PL2 may be connected to a second driving power source VSS such that a voltage of the second driving power source VSS is applied thereto.

For example, the light emitting unit EMU may include a first pixel electrode CNE1 (or first electrode) connected to the first driving power source VDD via the pixel circuit PXC and the first power line PL1, a second pixel electrode CNE2 (or second electrode) connected to the second driving power source VSS through the second power line PL2, and multiple light emitting elements LD connected in parallel in the same direction between the first pixel electrode CNE1 and the second pixel electrode CNE2. In an embodiment, the first pixel electrode CNE1 may be an anode (or anode electrode), and the second pixel electrode CNE2 may be a cathode (or cathode electrode).

Each of the light emitting elements LD included in the light emitting unit EMU may include a first end portion connected to the first driving power source VDD through the first pixel electrode CNE1 and a second end portion connected to the second driving power source VSS through the second pixel electrode CNE2. The first driving power source VDD and the second driving power source VSS may have different potentials. In an embodiment, the first driving power source VDD may be a high-potential power source, and the second driving power source VSS may be a low-potential power source. A potential difference between the first and second driving power sources VDD and VSS may be equal to or higher than a threshold voltage of the light emitting elements LD during an emission period of each sub-pixel SPXL.

As described above, the light emitting elements LD connected in parallel in the same direction (e.g., a forward direction) between the first pixel electrode CNE1 and the second pixel electrode CNE2, to which voltages having difference potentials are supplied, may form respective effective light sources.

Each of the light emitting elements LD of the light emitting unit EMU may emit light with a luminance corresponding to a driving current supplied through a corresponding pixel circuit PXC. For example, the pixel circuit PXC may supply, to the light emitting unit EMU, a driving current corresponding to a grayscale value of corresponding frame data during each frame period. The driving current supplied to the light emitting unit EMU may be divided to flow through each of the light emitting elements LD. Accordingly, the light emitting unit EMU may emit light with a luminance corresponding to the driving current while each light emitting element LD emits light with a luminance corresponding to a current flowing therethrough.

Although an embodiment in which both end portions of the light emitting elements LD are connected in the same direction between the first and second driving power sources VDD and VSS has been described, the disclosure is not limited thereto. In some embodiments, the light emitting unit EMU may include at least one ineffective light source, e.g., a reverse light emitting element LDr, in addition to the light emitting elements LD forming the respective effective light sources. The reverse light emitting element LDr may be connected in parallel with other light emitting elements LD forming the effective light sources between the first and the second pixel electrodes CNE1 and CNE2, and may be connected between the first and second pixel electrodes CNE1 and CNE2 in a direction opposite to which the other light emitting elements LD are connected. Even if a driving voltage (e.g., a forward driving voltage) is applied between the first and the second pixel electrodes CNE1 and CNE2, the reverse light emitting element LDr may maintain in an inactivated state, and accordingly, no current may substantially flow through the reverse light emitting element LDr.

The pixel circuit PXC of the sub-pixel SPXL may be connected to a scan line SLi (or first gate line) and a data line DLj. The pixel circuit PXC of the sub-pixel SPXL may be also connected to a control line CLi (or second gate line) and a sensing line SENj (or readout line). In an embodiment, in case that the sub-pixel SPXL is disposed on an ith row and a jth column of the display area DA, the pixel circuit PXC of the sub-pixel SPXL may be connected an ith scan line SLi, a jth data line DLj, an ith control line CLi, and a jth sensing line SENj of the display area DA. In some embodiments, the control line CLi may be connected to the scan line SLi or may be the scan line SLi.

The pixel circuit PXC may include transistors T1 to T3 and a storage capacitor Cst (or a capacitor).

A first transistor T1 may be a driving transistor for controlling a driving current applied to the light emitting unit EMU, and may be connected between the first driving power source VDD and the light emitting unit EMU. For example, a first terminal (or a first transistor electrode) of the first transistor T1 may be electrically connected to the first driving power source VDD through the first power line PL1, a second terminal (or second transistor electrode) of the first transistor T1 may be electrically connected to a second node N2, and a gate electrode of the first transistor T1 may be electrically connected to a first node N1. The first transistor T1 may control an amount of driving current applied to the light emitting unit EMU through the second node N2 from the first driving power source VDD according to a voltage applied to the first node N1. In an embodiment, the first terminal of the first transistor T1 may be a drain electrode, and the second terminal of the first transistor T1 may be a source electrode. However, the disclosure is not limited thereto. In some embodiments, the first terminal may be the source electrode, and the second terminal may be the drain electrode.

A second transistor T2 may be a switching transistor which selects a sub-pixel SPXL in response to a scan signal and activates the sub-pixel SPXL, and may be connected between the data line DLj and the first node N1. A first terminal of the second transistor T2 may be connected to the data line DLj, a second terminal of the second transistor T2 may be connected to the first node N1, and a gate electrode of the second transistor T2 may be connected to the scan line SLi. The first terminal and the second terminal of the second transistor T2 may be different terminals. For example, in case that the first terminal is a drain electrode, the second terminal may be a source electrode.

The second transistor T2 may be turned on in case that a scan signal having a gate-on voltage (e.g., a high level voltage) is supplied from the scan line SLi, to electrically connect the data line DLj and the first node N1 to each other. The first node N1 may be a point at which the second terminal of the second transistor T2 and the gate electrode of the first transistor T1 are connected to each other, and the second transistor T2 may transfer a data signal to the gate electrode of the first transistor T1.

A first terminal of a third transistor T3 may be connected to the sensing line SENj, a second terminal of the third transistor T3 may be connected to the second terminal of the first transistor T1, and a gate electrode of the third transistor T3 may be connected to the control line CLi. A voltage (an initialization voltage) from an initialization power source may be applied to the sensing line SENj. The third transistor T3 may be an initialization transistor capable of initializing the second node N2, and may be turned on in case that a sensing control signal is supplied from the control line CLi, to transfer the voltage of the initialization power source to the second node N2. Accordingly, a second storage electrode of the storage capacitor Cst, which is electrically connected to the second node N2, may be initialized. In some embodiments, the third transistor T3 may connect the first transistor T1 to the sensing line SENj, to acquire a sensing signal through the sensing line SENj and to detect a characteristic of the sub-pixel SPXL, including a threshold voltage of the first transistor, or the like, by using the sensing signal. Information on the characteristic of the sub-pixel SPXL may be used to convert image data such that a characteristic deviation between sub-pixels SPXL can be compensated.

The storage capacitor Cst may be formed between the first node N1 and the second node N2, or be electrically connected between the first node N1 and the second node N2. The storage capacitor Cst may charge a data voltage corresponding to the data signal supplied to the first node N1 during one frame period. Accordingly, the storage capacitor Cst may store a voltage corresponding to the difference between a voltage of the gate electrode of the first transistor T1 and a voltage of the second node N2.

A parasitic capacitor Cpara (or parasitic capacitance) may be formed between the first node N1 and a signal line adjacent to the first node N1. For example, the signal line may be the scan line SLi, the data line DLL and/or a power line to which the voltages of the first and second driving power sources VDD and VSS are applied. The parasitic capacitor Cpara may have an influence on a voltage (or voltage fluctuation) of the first node N1, and therefore, the sub-pixel SPXL may not emit light with a desired luminance. In order to reduce or exclude the influence of the parasitic capacitor Cpara, it may be necessary to increase a capacitance of the storage capacitor Cst. The influence of the parasitic capacitor Cpara will be described later with reference to FIG. 5, and the storage capacitor Cst having the increased capacitance will be described later with reference to FIG. 10.

The light emitting unit EMU may include at least one serial stage (or stage) including multiple light emitting elements LD electrically connected in parallel to each other.

In an embodiment, the light emitting unit EMU may be configured with a series/parallel hybrid structure. In an embodiment, as shown in FIG. 4B, the light emitting unit EMU may be configured to include a first serial stage SET1 and a second serial stage SET2. In another example, as shown in FIG. 4C, the light emitting unit EMU may be configured to include a first serial stage SET1, a second serial stage SET2, a third serial stage SET3, and a fourth serial stage SET4. The number of serial stages included in the light emitting unit EMU may be variously changed. For example, the light emitting unit EMU may include three or five or more serial stages.

Referring to FIG. 4B, the light emitting unit EMU may include a first serial stage SET1 and a second serial stage SET2, which are sequentially connected between the first driving power source VDD and the second driving power source VSS. Each of the first serial stage SET1 and the second serial stage SET2 may include two electrodes (CNE1 and CTE_S1 or CTE_S2 and CNE2) constituting an electrode pair of the corresponding serial stage and multiple light emitting elements LD connected in parallel in the same direction between the two electrodes (CNE1 and CTE_S1 or CTE_S2 and CNE2).

The first serial stage SET1 (or first stage) may include a first pixel electrode CNE1 (or second pixel electrode) and a first sub-intermediate electrode CTE_S1, and include at least one first light emitting element LD1 connected between the first pixel electrode CNE1 and the first sub-intermediate electrode CTE_S1. The first serial stage SET1 may further include a reverse light emitting element LDr connected in an opposite direction to other first light emitting element LD1 between the first pixel electrode CNE1 and the first sub-intermediate electrode CTE_S1.

The second serial stage SET2 (or second stage) may include a second sub-intermediate electrode CTE_S2 and a second pixel electrode CNE2 (or first pixel electrode), and include at least one second light emitting element LD2 connected between the second sub-intermediate electrode CTE_S2 and the second pixel electrode CNE2. The second serial stage SET2 may further include a reverse light emitting element LDr connected in an opposite direction to other second light emitting element LD2 between the second sub-intermediate electrode CTE_S2 and the second pixel electrode CNE2.

The first sub-intermediate electrode CTE_S1 of the first serial stage SET1 and the second sub-intermediate electrode CTE_S2 of the second serial stage SET2 may be integral with each other. In an embodiment, the first sub-intermediate electrode CTE_S1 and the second sub-intermediate electrode CTE_S2 may constitute a first intermediate electrode CTE1 for electrically connecting the first serial stage SET1 and the second serial stage SET2, which are consecutive. In case that the first sub-intermediate electrode CTE_S1 and the second sub-intermediate electrode CTE_S2 are integral with each other, the first sub-intermediate electrode CTE_S1 and the second sub-intermediate electrode CTE_S2 may be different portions of the first intermediate electrode CTE1. The terms "pixel electrode" and "intermediate electrode" are for distinguishing electrodes from each other, and a corresponding component (i.e., an electrode) is not limited by the terms.

Referring to FIG. 4C, the light emitting unit EMU may include a first serial stage SET1, a second serial stage SET2, a third serial stage SET3, and a fourth serial stage SET4, which are sequentially connected between the first driving power source VDD and the second driving power source VSS.

The first serial stage SET1 shown in FIG. 4C may be substantially identical to the first serial stage SET shown in FIG. 4B.

The second serial stage SET2 may include at least one second light emitting element LD2 connected between a second sub-intermediate electrode CTE_S2 and a third sub-intermediate electrode CTE_S3. The third serial stage SET3 may include at least one third light emitting element LD3 connected between a fourth sub-intermediate electrode CTE_S4 and a fifth sub-intermediate electrode CTE_S5. The fourth serial stage SET may include at least one fourth light emitting element LD4 connected between a sixth sub-intermediate electrode CTE_S6 and a second pixel electrode CNE2. The third sub-intermediate electrode CTE_S3 and the fourth sub-intermediate electrode CTE_S4 may be integral with each other, and may constitute a second intermediate electrode CTE2. The fifth sub-intermediate electrode CTE_S5 and the sixth sub-intermediate electrode CTE_S6 may be integral with each other, and may constitute a third intermediate electrode CTE3.

The light emitting unit EMU of the sub-pixel SPXL, which includes serial stages SET1 to SET4 (or light emitting elements LD) connected in a series/parallel hybrid structure, may readily control driving current/voltage to be suitable for specifications of a product to which the light emitting unit EMU is applied.

For example, the light emitting unit EMU of the sub-pixel SPXL, which includes the serial stages SET1 to SET4, may decrease a driving current, as compared with a light emitting unit having a structure in which light emitting elements LD are connected only in parallel. In other words, the light emitting unit EMU of the sub-pixel SPXL, which includes the serial stages SET1 to SET4, may emit light with a higher luminance with a same driving current.

Also, the light emitting unit EMU of the sub-pixel SPXL, which includes the serial stages SET1 to SET4, may decrease a driving voltage applied to both ends of the light emitting unit EMU, as compared with a light emitting unit having a structure in which the same number of light emitting elements LD are connected only in series.

Although a case where the transistors T1 to T3 included in the pixel circuit PXC are all n-type transistors is illustrated in FIGS. 4A, 4B, and 4C, the disclosure is not necessarily limited thereto. For example, at least one of the transistors T1 to T3 may be changed to a p-type transistor.

The structure and driving method of the sub-pixel SPXL may be variously changed. For example, the pixel circuit PXC may be configured as a pixel circuit having various structures and/or various driving methods, different from the embodiment shown in FIGS. 4A, 4B, and 4C.

In an embodiment, the pixel circuit PXC may not include the third transistor T3. Also, the pixel circuit PXC may include other circuit elements such as a compensation transistor for compensating the threshold voltage of the first transistor T1, or the like, an initialization transistor for initializing a voltage of the first node N1 and/or the first pixel electrode CNE1, an emission control transistor for controlling a period in which a driving current is supplied to the light emitting unit EMU, and/or a boosting capacitor for boosting the voltage of the first node N1.

Figure 5:
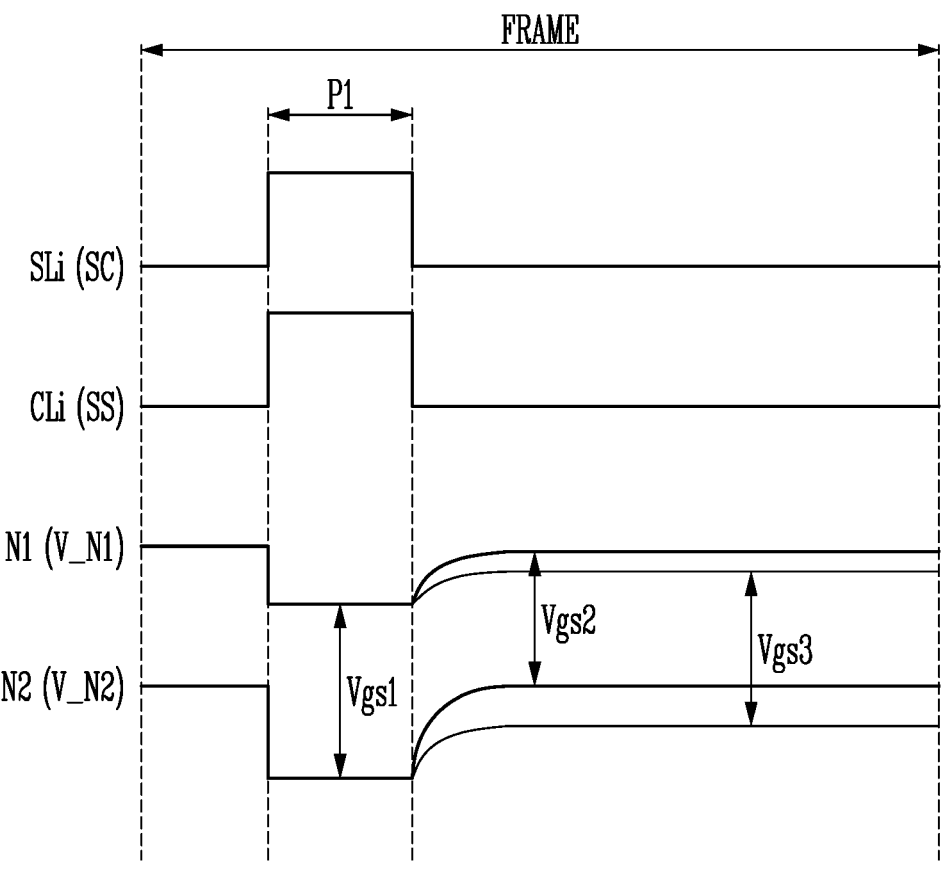
FIG. 5 is a schematic waveform diagram illustrating an operation of the pixel shown in FIG. 4A.

FIG. 5 is a schematic waveform diagram illustrating an operation of the pixel shown in FIG. 4A.

Referring to FIGS. 4A and 5, in a first period P1, a scan signal SC (or first gate signal) applied to the scan line SLi may have a gate-on voltage (e.g., a high level voltage), and a sensing control signal SS (or second gate signal) applied to the control line CLi may have the gate-on voltage. The first period P1 may be a period allocated to write a data signal to the sub-pixel SPXL in one frame FRAME. The first period P1 may be a non-emission period, and the period other than the first period P1 (i.e., the other period of the frame FRAME, particularly, the period following the first period P1) may be an emission period.

The second transistor T2 may be turned on in response to the scan signal SC having the gate-on voltage, the data signal may be applied from the data line DLj to the first node N1, and the voltage of the first node N1, i.e., a first node voltage V_N1 may be changed. Similarly, the third transistor T3 may be turned on in response to the sensing control signal SS having the gate-on voltage, the voltage of the initialization voltage may be applied to the second node N2, and the voltage of the second node N2, i.e., a second node voltage V_N2 may be changed. A voltage corresponding to a difference between the first node voltage V_N1 and the second node voltage V_N2 may be charged in the storage capacitor Cst.

As a driving current flows through the first transistor T1 after the first period P1, the second node voltage V_N2 may increase, and the first node voltage V_N1 may increase corresponding to the increase in the second node voltage V_N2 due to the storage capacitor Cst. An ideal voltage difference (i.e., Vgs2) between the first node voltage V_N1 and the second node voltage V_N2 after the first period P1 may be equal to a voltage difference (i.e., Vgs1) in the first period P1. However, an actual voltage difference (i.e., Vgs3) may be different from the voltage difference (i.e., Vgs1) in the first period P1 due to the parasitic capacitor Cpara and a change in threshold voltage of the first transistor T1 (e.g., a negative shift of the threshold voltage), and the sub-pixel SPXL may emit light a luminance different from a desired luminance. In order to eliminate the influence of the parasitic capacitor Cpara, the sub-pixel SPXL may be provided with a storage capacitor Cst having an increased capacitance.

Figure 6:
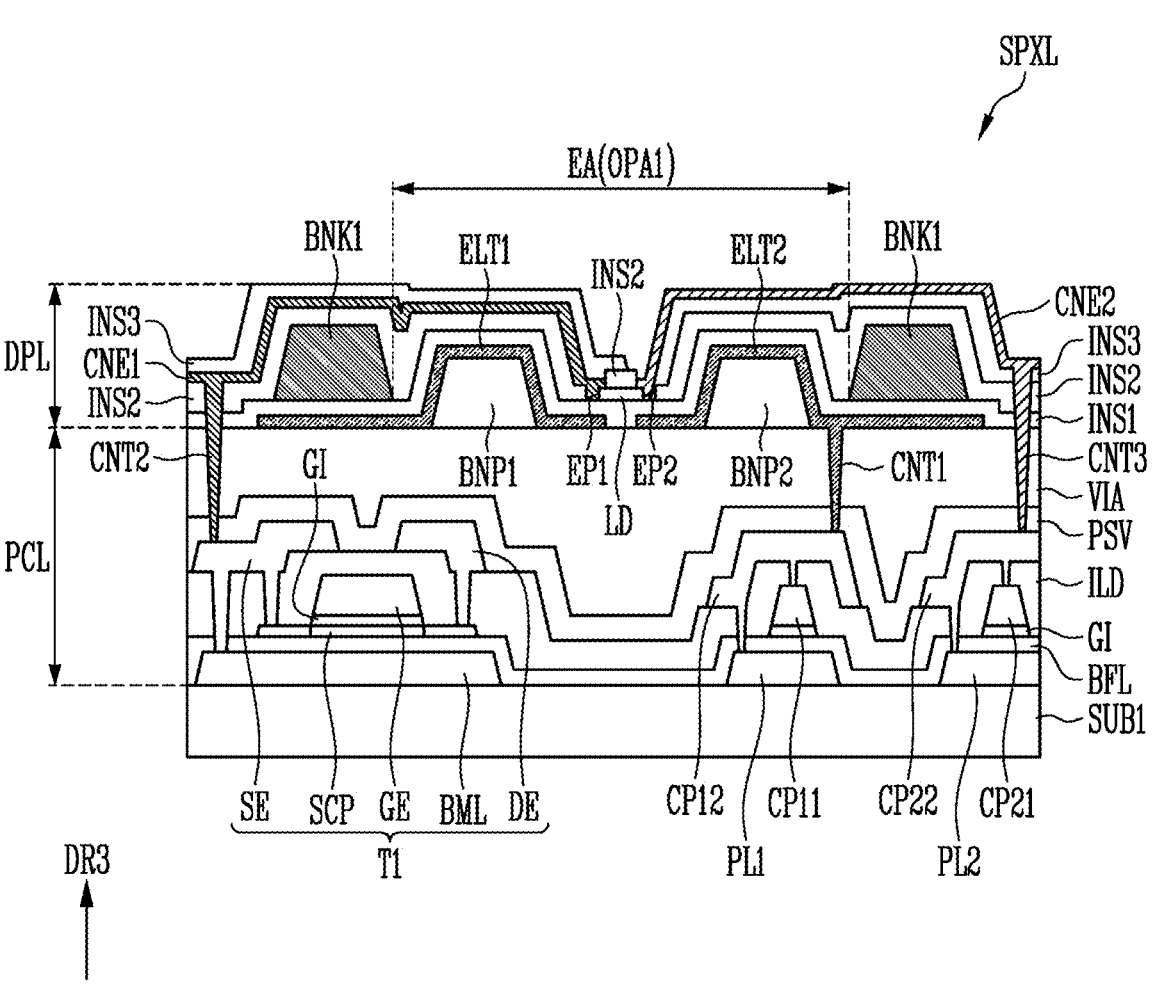
FIG. 6 is a schematic cross-sectional view illustrating a sub-pixel in the display device shown FIG. 3 in accordance with an embodiment of the disclosure.

FIG. 6 is a schematic cross-sectional view illustrating the sub-pixel in the display device shown FIG. 3 in accordance with an embodiment of the disclosure. In FIG. 6, a first transistor T1 (see FIG. 4A) and first and second power lines PL1 and PL2 are illustrated as an example of circuit elements which may be disposed in a pixel circuit layer PCL.

Referring to FIG. 6, the sub-pixel SPXL (or the display device) may include a pixel circuit layer PCL and a display element layer DPL, which are disposed on a first substrate SUB1.

The pixel circuit layer PCL may include a first transistor T1, a first power line PL1 and a second power line PL2, and multiple insulating layers BFL, GI, ILD, PSV, and VIA. The first transistor T1 may include a bottom metal layer BML, a semiconductor pattern SCP, a gate electrode GE, a source electrode SE (second transistor electrode or second terminal), and a drain electrode DE (first transistor electrode or first terminal).

A first conductive layer may be located between the first substrate SUB1 and a buffer layer BFL. The first conductive layer may include a conductive material. The conductive material may include at least one metal among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, or alloys thereof. The first conductive layer may be configured as a single layer, a double layer, or a multi-layer.

The first conductive layer may include the bottom metal layer BML, the first power line PL1, and the second power line PL2. The bottom metal layer BML and the gate electrode GE of the first transistor T1 may overlap with each other with the buffer layer BFL interposed therebetween. The bottom metal layer BML may be disposed below the semiconductor pattern SCP of the first transistor T1. The bottom metal layer BML may serve as a light blocking pattern, thereby stabilizing an operational characteristic of the first transistor T1.

In some embodiments, the first transistor T1 may not include the bottom metal layer BML. The buffer layer BFL may be located directly on the first substrate SUB1. The bottom metal layer BML may be physically and/or electrically connected to the source electrode SE of the first transistor T1 which will be described later through a contact hole of an insulating layer. Accordingly, a threshold voltage of the first transistor T1 may be moved in a negative direction or a positive direction.

The buffer layer BFL (or first insulating layer) may cover the first conductive layer, and may be located on the first substrate SUB1.

The buffer layer BFL may prevent an impurity from being diffused into the pixel circuit layer PCL. The buffer layer BFL may include an inorganic material. For example, the inorganic material may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be omitted depending on a material of the substrate SUB, a process condition, and the like.

The semiconductor pattern SCP may be located on the buffer layer BFL. The semiconductor pattern SCP may include a first region (e.g., a source region) connected to the source electrode SE, a second region (e.g., a drain region) connected to the drain electrode DE, and a channel region between the first and second regions. The channel region may overlap the gate electrode GE of the first transistor T1 in a third direction DR3 (a thickness direction of the first substrate DUB1). The semiconductor pattern SCP may be made of poly-silicon, amorphous silicon, an oxide semiconductor, or the like.

A gate insulating layer GI (or second insulating layer) may be disposed over the semiconductor pattern SCP. The gate insulating layer GI may be disposed only on the semiconductor pattern SCP, or may be disposed on an entire area of the first substrate SUB1. The gate insulating layer GI may include an inorganic material. However, the disclosure is not limited thereto, and the gate insulating layer GI may include an organic material. For example, the organic material may include at least one of an acrylic resin, an epoxy resin, a phenolic resin, a polyamide resin, a polyimide resin, an unsaturated polyester resin, a poly-phenylene ether resin, a poly-phenylene sulfide resin, and a benzocyclobutene resin.

A second conductive layer may be disposed on the gate insulating layer GI. The second conductive layer may include a conductive material, similar to the first conductive layer. The second conductive layer may include the gate electrode GE, an eleventh connection pattern CP11, and a twenty-first connection pattern CP21.

The gate electrode GE may be disposed on the gate insulating layer GI to overlap the channel region of the semiconductor pattern SCP. The eleventh connection pattern CP11 may overlap the first power line PL1 in the third direction DR3, and the twenty-first connection pattern CP21 may overlap the second power line PL2 in the third direction DR3.

An interlayer insulating layer ILD (first interlayer insulating layer or third insulating layer) may cover the second conductive layer, and may be disposed on an entire area of the first substrate SUB1. The interlayer insulating layer ILD may include an inorganic material, similar to the gate insulating layer GI. The interlayer insulating layer ILD may include an organic material.

A third conductive layer may be disposed on the interlayer insulating layer ILD. The third conductive layer may include a conductive material, similar to the first conductive layer. The third conductive layer may include the source electrode SE, the drain electrode DE, a twelfth connection pattern CP12, and a twenty-second connection pattern CP22.

The source electrode SE may be in contact with or connected to the first region of the semiconductor pattern SCP through a contact hole penetrating the interlayer insulating layer ILD, and be in contact with or connected to the bottom metal layer BML through a contact hole penetrating the interlayer insulating layer ILD and the buffer layer BFL. The drain electrode DE may be in contact with or connected to the second region of the semiconductor pattern SCP through a contact hole penetrating the interlayer insulating layer ILD. Similar to the source electrode SE, the twelfth connection pattern CP12 may be in contact with or connected to the first power line PL1 and the eleventh connection pattern CP11, and the twenty-second connection pattern CP22 may be in contact with or connected to the second power line PL2 and the twenty-first connection pattern CP21. The eleventh connection pattern CP11 and the twelfth connection pattern CP12 may be connected to the first power line PL1, to reduce resistance of the first power line PL1. Similarly, the twenty-first connection pattern CP21 and the twenty-second connection pattern CP22 may be connected to the second power line PL2, to reduce resistance of the second power line PL2.

A protective layer PSV (or second interlayer insulating layer) may be disposed on an entire area of the first substrate SUB1 to cover the third conductive layer. The protective layer PSV may include an inorganic material. The protective layer PSV may be provided as a single layer or a multi-layer including two or more layers. In some embodiments, the protective layer PSV may be omitted.

A via layer VIA (or passivation layer) may be disposed on the protective layer PSV. The via layer VIA may be disposed on an entire area of the first substrate SUB1. The via layer VIA may include an organic material. A flat surface may be provided on the top of the via layer VIA.

The display element layer DPL may be located on the via layer VIA.

The display element layer DPL may include first and second bank patterns BNP1 and BNP2, first and second electrodes ELT1 and ELT2 (alignment electrodes or reflective electrodes), a first bank BNK1, a light emitting element LD, first and second pixel electrodes CNE1 and CNE2 (or contact electrodes), and multiple insulating layers INS1 to INS3.

The first and second bank patterns BNP1 and BNP2 may be disposed on the via layer VIA.

Each of the first and second bank patterns BNP1 and BNP2 may have a trapezoidal shape in a cross-sectional view, of which width becomes narrower as approaching the top thereof along a third direction DR3 from a surface (e.g., an upper surface) of the via layer VIA. In some embodiments, each of the first and second bank patterns BNP1 and BNP2 may include a curved surface having a semi-elliptical shape, a semicircular shape (or hemisphere shape), or the like in a cross-sectional view, of which width becomes narrower as approaching the top thereof along the third direction DR3 from the surface of the via layer VIA. However, the cross-sectional shape of each of the first and second bank patterns BNP1 and BNP2 is not limited to the above-described embodiments, and may be variously changed within a range so that the efficiency of light emitted from each of light emitting elements LD can be improved.

The first and second bank patterns BNP1 and BNP2 may include an inorganic material and/or an organic material, and may be configured as a single layer or a multi-layer. In some embodiments, the first and second bank patterns BNP1 and BNP2 may be omitted. For example, a structure corresponding to the first and second bank patterns BNP1 and BNP2 may be formed in the via layer VIA.

The first and second electrodes ELT1 and ELT2 may be disposed on the via layer VIA and the first and second bank patterns BNP1 and BNP2.

The first electrode ELT1 may be disposed over the first bank pattern BNP1, and the second electrode ELT2 may be disposed over the second bank pattern BNP2. The first and second electrodes ELT1 and ELT2 may have surface profiles respectively corresponding to the shapes of the first and second bank patterns BNP1 and BNP2 in a cross-sectional view.

Each of the first and second electrodes ELT1 and ELT2 may include a conductive material having a reflexibility to reflect light emitted from the light emitting element LD to an image display direction of the display device (e.g., the third direction DR3). Each of the first and second electrodes ELT1 and ELT2 may be configured as a single layer or a multi-layer.

The second electrode ELT2 (or the first electrode ELT1) may be in contact with or connected to the twelfth connection pattern CP12 through a first contact hole CNT1 penetrating the via layer VIA and the protective layer PSV. The second electrode ELT2 (or the first electrode ELT1) may be electrically connected to the first power line PL1. The second electrode ELT2 may be directly connected to the twelfth connection pattern CP12, but the disclosure is not limited thereto. For example, the second electrode ELT2 may be connected to the twelfth connection pattern CP12 (the eleventh connection pattern CP11 or the first power line PL1) through a bridge electrode.

The first and second electrodes ELT1 and ELT2 may be used as alignment electrodes for aligning the light emitting element LD in a manufacturing process of the display device.

A first insulating layer INS1 may be disposed on the via layer VIA to cover at least a portion of the first and second electrodes ELT1 and ELT2. The first insulating layer INS1 may be located between the first electrode ELT1 and the second electrode ELT2, and may prevent a short (e.g., a short circuit) between the first electrode ELT1 and the second electrode ELT2. The first insulating layer INS1 may include an inorganic material or an organic material.

The light emitting element LD may be disposed on the first insulating layer INS1. The light emitting element LD may be aligned between the first electrode ELT1 and the second electrode ELT2 such that a first end portion EP1 of the light emitting element LD faces the first electrode ELT1 and a second end portion EP2 of the light emitting element LD faces the second electrode ELT2.

The first end portion EP1 of the light emitting element LD may partially overlap the first electrode ELT1 in the third direction DR3, and the second end portion EP2 of the light emitting element LD may partially overlap the second electrode ELT2 in the third direction DR3. However, the disclosure is not limited thereto.

The first bank BNK1 may be disposed on the first insulating layer INS1. The first bank BNK1 may have a dam structure which prevents a solution including the light emitting element LD from being introduced into an adjacent sub-pixel SPXL or controls a certain amount of solution to be supplied to each sub-pixel SPXL. Also, the first bank BNK1 may define an emission area EA. For example, the emission area EA may correspond to an opening OPA1 of the first bank BNK1.

The first bank BNK1 may include an organic material. In some embodiments, the first bank BNK1 may include a light blocking material and/or a reflective material. The first bank BNK1 may prevent a light leakage defect in which light (or beam) is leaked between adjacent sub-pixels SPXL. For example, the first bank BNK1 may include a color filter material or a black matrix material. In another example, a reflective layer may be separately provided and/or formed over the first bank BNK1 so as to further improve the efficiency of light emitted to the outside from the sub-pixel SPXL.

A second insulating layer INS2 (or second insulating pattern) may be disposed on the light emitting element LD. The second insulating layer INS2 may be located on a portion of a top surface of the light emitting element LD such that the first end portion EP1 and the second end portion EP2 of the light emitting element LD are not covered by the second insulating layer INS2. In some embodiments, the second insulating layer INS2 may be disposed on the first insulating layer INS1 and the first bank BNK1.

The second insulating layer INS2 may include an inorganic material or an organic material depending on a design condition of the display device including the light emitting element LD, and the like. After the light emitting element LD is aligned on the first insulating layer INS1, the second insulating layer INS2 may be formed on the light emitting element LD, so that the light emitting element LD can be prevented from being separated at the position at which the light emitting element LD is aligned. In case that an empty gap (or space) exists between the first insulating layer INS1 and the light emitting element LD before the second insulating layer INS2 is formed, the empty gap may be filled with the second insulating layer INS2 in a process of forming the second insulating layer INS2.

The first pixel electrode CNE1 may be disposed on the first electrode ELT1. The first pixel electrode CNE1 may be in direct contact with the first end portion EP1 of the light emitting element LD. The first pixel electrode CNE1 may be in contact with or connected to the source electrode SE of the first transistor T1 through a second contact hole CNT2 penetrating the second insulating layer INS2, the first insulating layer INS1, the via layer VIA, and the protective layer PSV. For example, the first pixel electrode CNE1 may electrically connect the first end portion EP1 of the light emitting element LD to the source electrode SE of the first transistor T1.

The first pixel electrode CNE1 and the second pixel electrode CNE2 may include a transparent conductive material such as indium tin oxide (ITO), indium zinc oxide (IZO), zinc oxide ($ZnO_x$), or indium gallium zinc oxide (IGZO).

A third insulating layer INS3 may be located over the second insulating layer INS2 and the first pixel electrode CNE1 to cover the second insulating layer INS2 and the first pixel electrode CNE1. The third insulating layer INS3 may be located such that an edge of the third insulating layer INS3 is in contact with an end of the second insulating layer INS2. Therefore, the second end portion EP2 of the light emitting element LD may be exposed.

The third insulating layer INS3 may include an inorganic material or an organic material.

The second pixel electrode CNE2 may be disposed on the second electrode ELT2. The second pixel electrode CNE2 may be in direct contact with the second end portion EP2 of the light emitting element LD. The second pixel electrode CNE2 may be in contact with or connected to the twenty-second connection pattern CP22 through a third contact hole CNT3 penetrating the third insulating layer INS3, the second insulating layer INS2, the first insulating layer INS1, the via layer VIA, and the protective layer PSV. For example, the second pixel electrode CNE2 may electrically connect the second end portion EP2 of the light emitting element LD to the second power line PL2.

A transparent conductive material (e.g., ITO) may have an excellent bonding force with a conductive layer (e.g., the source electrode SE and the twenty-second connection pattern CP22) in the pixel circuit layer PCL and a low contact resistance, as compared with a conductive material (or metallic material) having a specific reflexibility. Therefore, the first and second pixel electrodes CNE1 and CNE2 may be directly connected to a component in the pixel circuit layer PCL without connecting to the first and second electrodes ELT1 and ELT2, but. However, the disclosure is not limited thereto.

Although a case where the first pixel electrode CNE1 and the second pixel electrode CNE2 are located in different layers with the third insulating layer INS3 interposed therebetween has been described in FIG. 6, the disclosure is not limited thereto. For example, the first pixel electrode CNE1 and the second pixel electrode CNE2 may be disposed on a same layer (e.g., the second insulating layer INS2) through a same process.

Figure 7A:
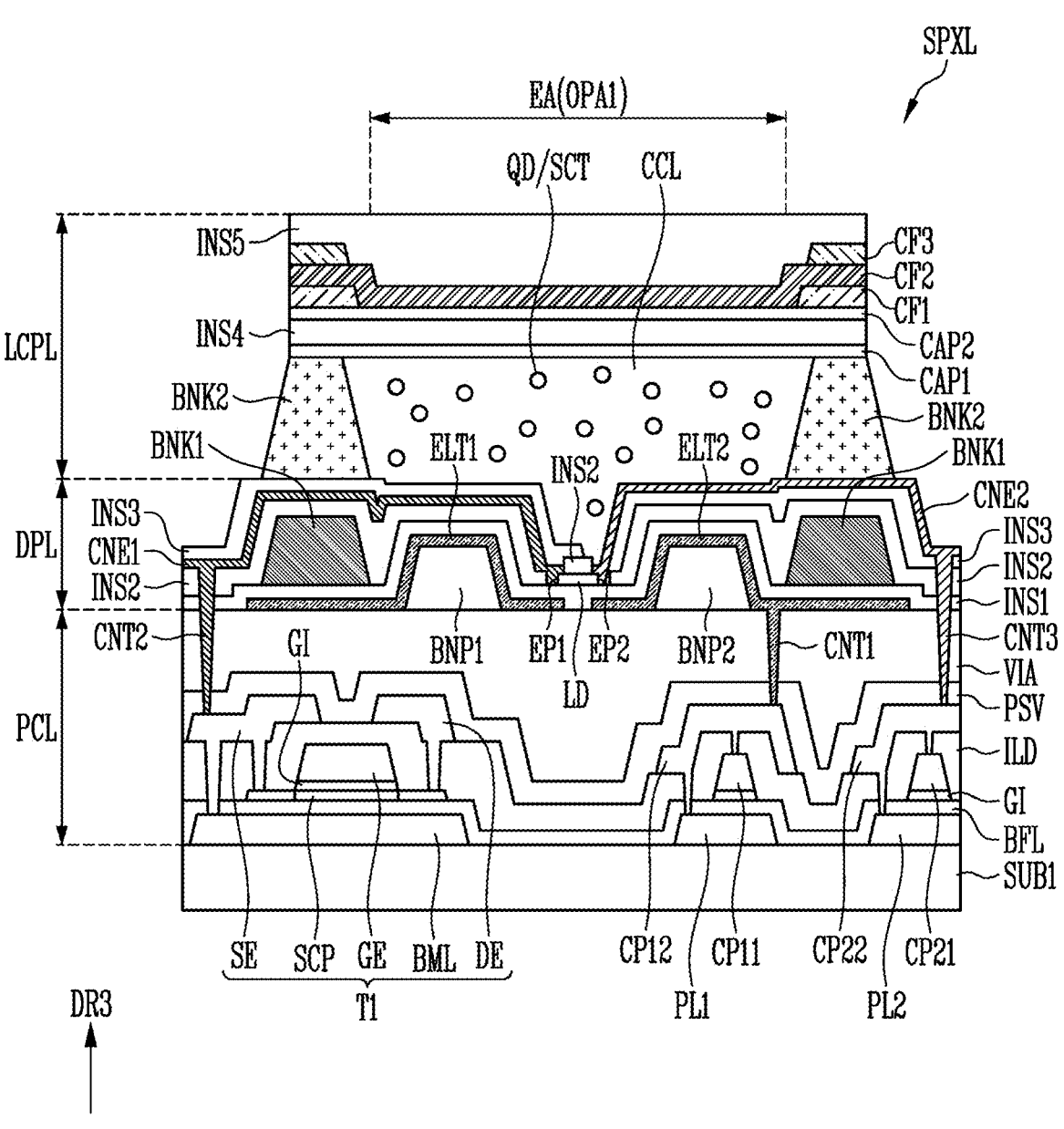
FIG. 7A is a schematic cross-sectional view illustrating the sub-pixel in the display device shown FIG. 3 in accordance with an embodiment of the disclosure.
Figure 7B:
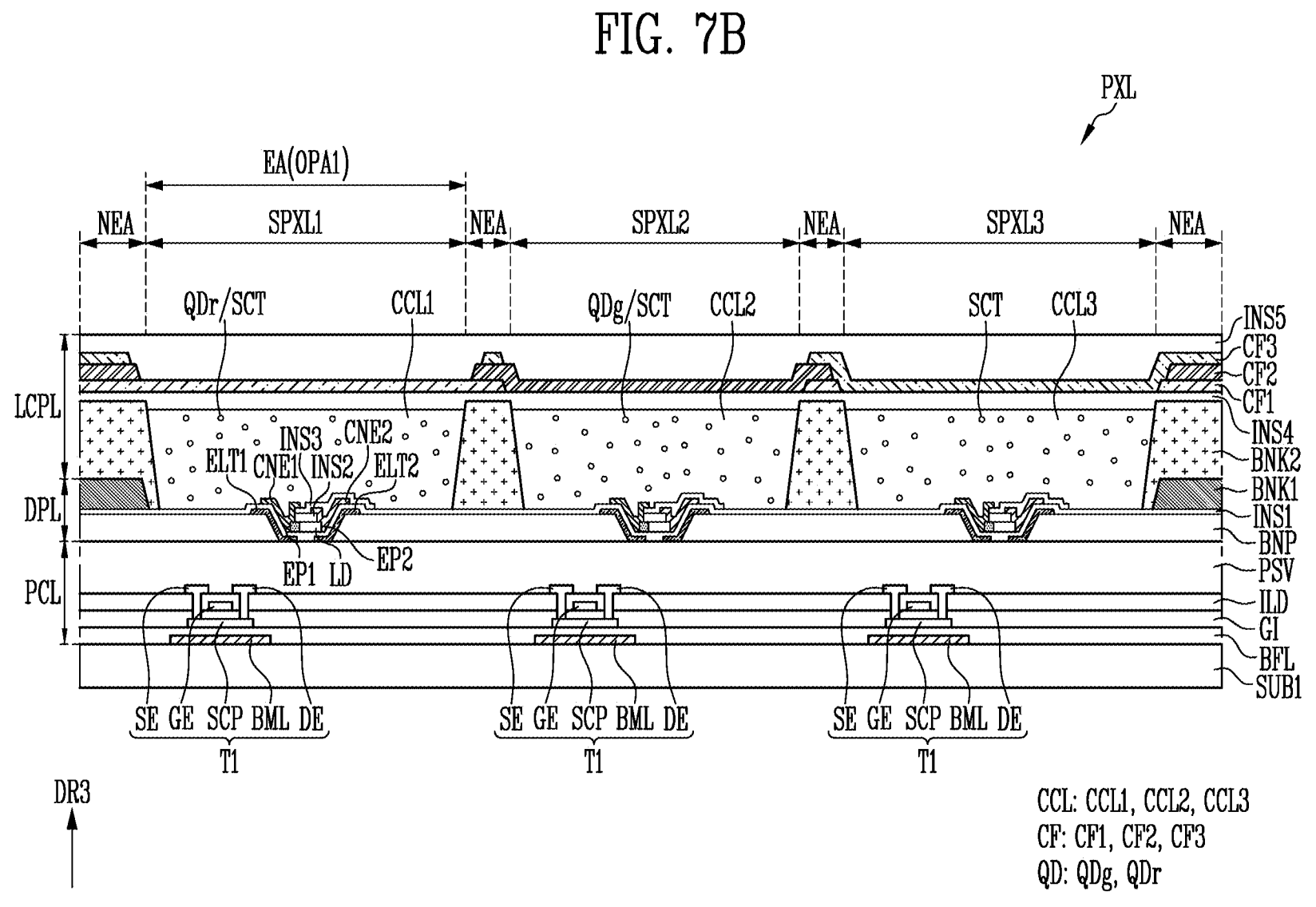
Figure 7C:
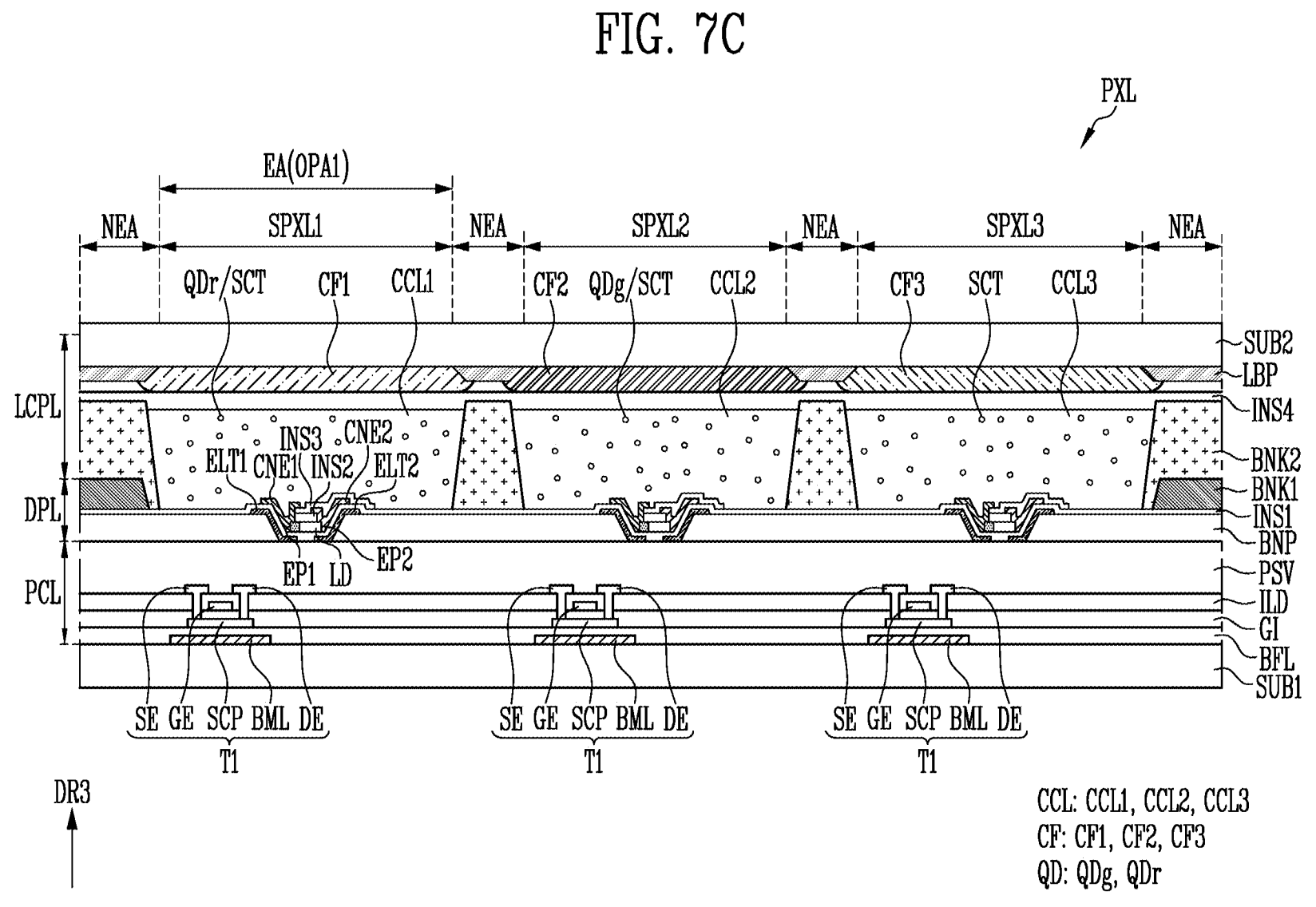

FIG. 7A is a schematic cross-sectional view illustrating the sub-pixel in the display device shown FIG. 3 in accordance with an embodiment of the disclosure. FIGS. 7B and 7C are schematic cross-sectional views each illustrating the pixel in the display device shown in FIG. 3 in accordance with an embodiment of the disclosure. FIG. 7C illustrates another embodiment of the pixel with a modified position of a color conversion layer CCL compared to the embodiment in FIG. 7B. For example, an embodiment in which the color conversion layer CCL is located on the top of the display element layer DPL through a continuous process is disclosed in FIG. 7B, and an embodiment in which a second substrate SUB2 including the color conversion layer CCL is located on the display element layer DPL through an adhesion process is disclosed in FIG. 7C. In relation to the embodiments shown in FIGS. 7A, 7B, and 7C, portions different from those of the above-described embodiments (e.g., the embodiment shown in FIG. 6) will be described to avoid redundancy.

Referring to FIGS. 6 and 7A, the sub-pixel SPXL (or the display device) may further include a light conversion layer LCPL disposed on the display element layer DPL.

The light conversion layer LCPL may include a second bank BNK2, a color conversion layer CCL, and color filters CF1 to CF3.

The second bank BNK2 may be disposed on the display element layer DPL. The second bank BNK2 may be located in a non-emission area NEA (see FIG. 7B), and may have a structure defining a position at which the color conversion layer CCL is to be supplied.

The second bank BNK2 may include an organic material. In some embodiments, the second bank BNK2 may include a light blocking material. In an embodiment, the second bank BNK2 may be a black matrix. In some embodiments, the second bank BNK2 may include at least one light blocking material and/or at least one reflective material. Thus, the second bank BNK2 reflect light emitted from the color conversion layer CCL to the image display direction of the display device (or the third direction DR3), thereby improving light emission efficiency of the sub-pixel SPXL.

The color conversion layer CCL may be disposed on the display element layer DPL (or the light emitting element LD) in an area surrounded by the second bank BNK2.

The color conversion layer CCL may include color conversion particles QD (or wavelength conversion particles) corresponding to a specific color. In an embodiment, the color conversion layer CCL may include color conversion particles QD for converting light of a first color (or first wavelength band), which is incident from the light emitting element LD, into light of a second color (specific color or second wavelength band) and releasing the light having the converted wavelength.

Referring to FIG. 7B, in case that the first sub-pixel SPXL1 is a red pixel (or red sub-pixel), a first color conversion layer CCL1 of the first sub-pixel SPXL1 may include first color conversion particles QDr of a red quantum dot, which convert light of the first color, which is emitted from the light emitting element LD, into light of the second color, e.g., light of red.

In case that the second sub-pixel SPXL2 is a green pixel (or green sub-pixel), a second color conversion layer CCL2 of the second sub-pixel SPXL2 may include second color conversion particles QDg of a green quantum dot, which convert light of the first color, which is emitted from the light emitting element LD, into light of a third color, e.g., light of green.

In case that the third sub-pixel SPXL3 is a blue pixel (or blue sub-pixel), a third color conversion layer CCL3 of the third sub-pixel SPXL3 may include color conversion particles of a blue quantum dot, which convert light of the first color, which is emitted from the light emitting element LD, into light of a fourth color, e.g., light of blue.

In some embodiments, in case that the third sub-pixel SPXL3 is the blue pixel (or blue sub-pixel), and the light emitting element LD emits blue series light, the third sub-pixel SPXL3 may include a light scattering layer including light scattering particles SCT. The above-described light scattering layer may be omitted in some embodiments. In other embodiments, in case that the third sub-pixel SPXL3 is the blue pixel (or blue sub-pixel), transparent polymer may be provided instead of the third color conversion layer CCL3.

Referring back to FIG. 7A, a fourth insulating layer INS4 may be disposed over the color conversion layer CCL and the second bank BNK2.

The fourth insulating layer INS4 may be provided on an entire area of the first substrate SUB1 to cover the second bank BNK2 and the color conversion layer CCL. The fourth insulating layer INS4 may include an inorganic material and/or an organic material. In some embodiments, the fourth insulating layer INS4 may totally reflect light emitted from the color conversion layer CCL (e.g., light advancing in an oblique direction) by using a refractive index difference between the fourth insulating layer INS4 and an adjacent component, and improve the light emission efficiency of the sub-pixel SPXL. To this end, the fourth insulating layer INS4 may have a lower refractory index compared to the color conversion layer CCL.

In some embodiments, the fourth insulating layer INS4 may reduce a step difference by components disposed below thereof, and may have a flat surface.

In an embodiment, first and second capping layers CAP1 and CAP2 may be respectively disposed on the top and the bottom of the fourth insulating layer INS4.

The first capping layer CAP1 may be disposed on the color conversion layer CCL, and prevent moisture (or a solution used in a subsequent process) from infiltrating into the color conversion layer CCL from the bottom thereof. The first capping layer CAP1 may include an inorganic material.

The second capping layer CAP2 may be disposed on the fourth insulating layer INS4, and include an inorganic material. The second capping layer CAP2 may prevent moisture from infiltrating into the fourth insulating layer INS4. In some embodiments, the second capping layer CAP2 may increase adhesion between the fourth insulating layer INS4 and the color filter layer.

The color filter layer may be disposed on the fourth insulating layer INS4.

Referring to FIG. 7B, the color filter layer may include a color filter CF corresponding to a color of each of adjacent sub-pixels. For example, a first color filter CF1 may be disposed on the first color conversion layer CCL1 of the first sub-pixel SPXL1, a second color filter CF2 may be disposed on the second color conversion layer CCL2 of the second sub-pixel SPXL2, and a third color filter CF3 may be disposed on the third color conversion layer CCL3 of the third sub-pixel SPXL3. Each of the first, second, and third color filters CF1, CF2, and CF3 may include a color filter material for allowing light of a specific color, which is converted in the color conversion layer CCL, to be selectively transmitted therethrough. In an embodiment, the first color filter CF1 may be a red color filter, the second color filter CF2 may be a green color filter, and the third color filter CF3 may be a blue color filter. The above-described color filter CF may be provided on a surface of the fourth insulating layer INS4 to correspond to the color conversion layer CCL.

The first, second, and third color filters CF1, CF2, and CF3 may be disposed in the non-emission area NEA to overlap with one another, to block light interference between adjacent sub-pixels. In some embodiments, a separate light blocking pattern instead of a stacked structure of the first, second, and third color filters CF1, CF2, and CF3 may be disposed in the non-emission area NEA.

A fifth insulating layer INS5 may be disposed over the color filter layer. The fifth insulating layer INS5 may include an inorganic material or an organic material. The fifth insulating layer INS5 may entirely cover components located below thereof, thereby blocking moisture, humidity or the like from being introduced into the color filter layer and the display element layer DPL from the outside. In an embodiment, the fifth insulating layer INS5 may be formed as a multi-layer. For example, the fifth insulating layer INS5 may include at least two inorganic layers and at least one organic layer interposed between the at least two inorganic layers. However, the material and/or structure of the fifth insulating layer INS5 may be variously changed. In some embodiments, at least one overcoat layer, at least one filler layer, and/or an upper substrate may be further disposed on the fifth insulating layer INS5.

Although a case where the color conversion layer CCL is directly formed on the display element layer DPL has been described in the above-described embodiment, the disclosure is not limited thereto. In some embodiments, the color conversion layer CCL may be formed on a separated substrate, e.g., a second substrate SUB2 as shown in FIG. 7C, to be coupled to the display layer DPL through an adhesive material. For example, the adhesive material may be an optically clear adhesive, but the disclosure is not limited thereto.

The second substrate SUB2 (or upper substrate) may constitute an encapsulation substrate and/or a window member of the display device. The second substrate SUB2 and the first substrate SUB1 may be formed of a same material or different materials.

Referring to FIG. 7C, the color conversion layer CCL and the color filter layer CF may be disposed below the second substrate SUB2 to face the display element layer DPL.

A light blocking pattern LBP may be located adjacent to the color conversion layer CCL and the color filter CF. The light blocking pattern LBP may be disposed below the second substrate SUB2 corresponding to the non-emission area NEA. The light blocking pattern LBP may be a black matrix.

In case that the sub-pixel SPXL includes a light conversion layer LCPL on the display element layer DPL, i.e., in case that the sub-pixel SPXL includes a color conversion layer CCL and a color filter, which are disposed over the light emitting element LD, light having excellent color reproducibility may be emitted through the color conversion layer CCL and the color filter CF, and the light emission efficiency of the sub-pixel SPXL may be improved.

Figure 8:
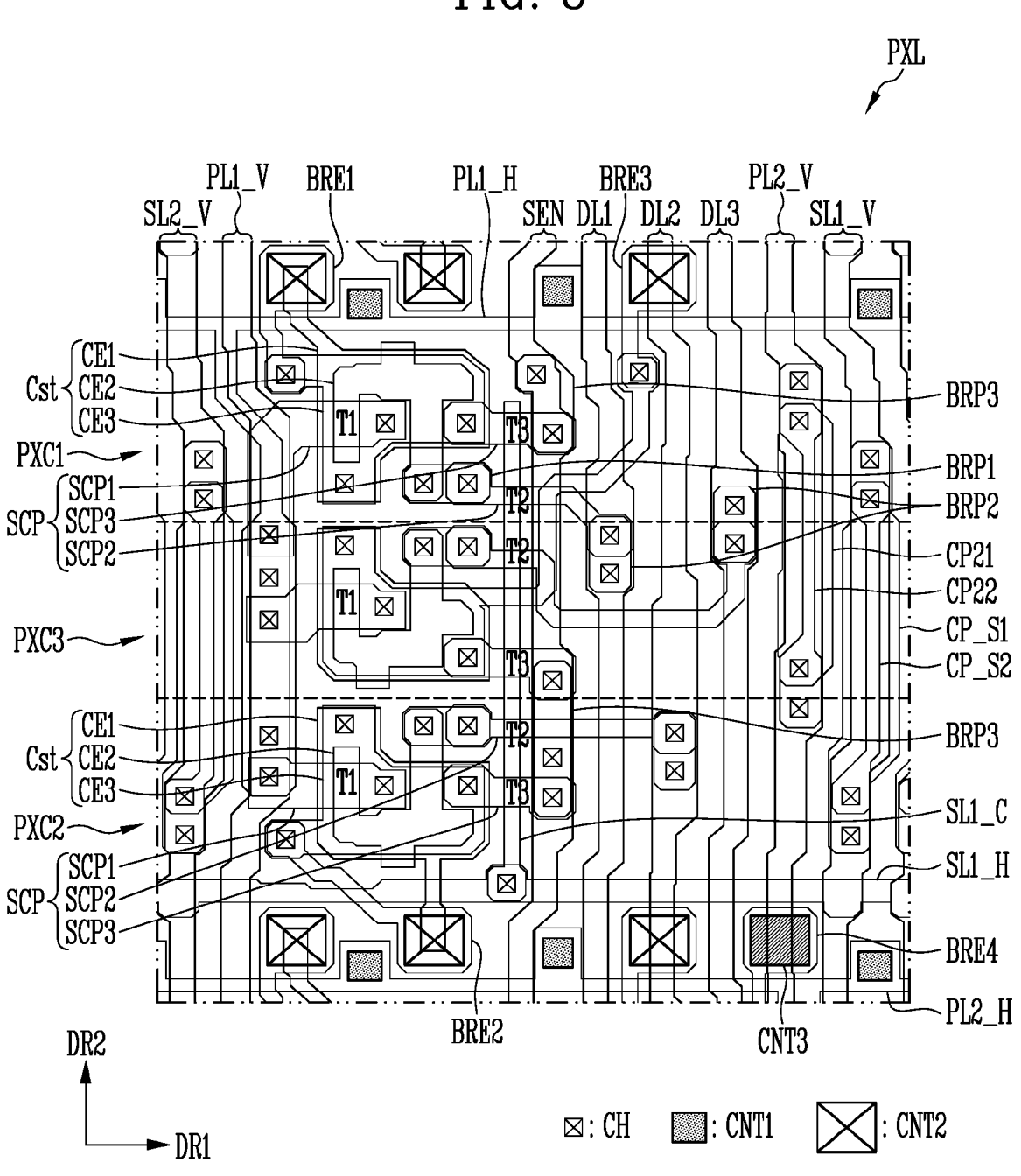
FIG. 8 is a layout view illustrating the pixel in the display device shown in FIG. 3 in accordance with an embodiment of the disclosure.
Figure 9A:
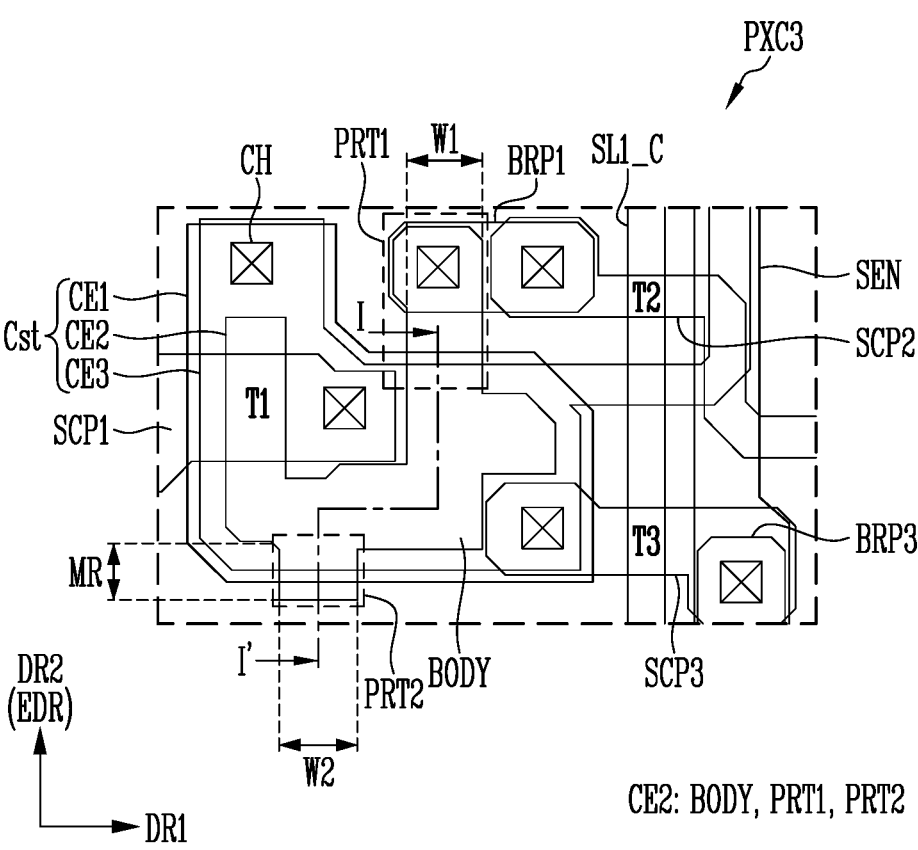
FIG. 9A is an enlarged plan view of a third pixel circuit in the pixel shown in FIG. 8 in accordance with an embodiment of the disclosure.
Figure 9B:
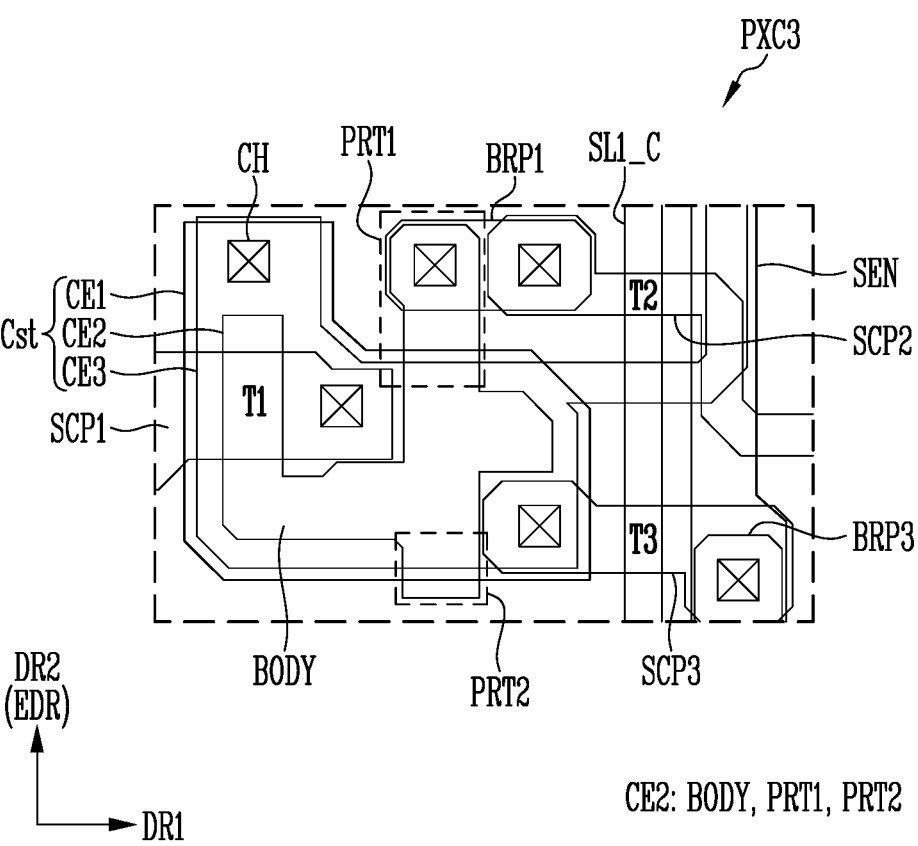
FIG. 9B is an enlarged plan view of a third pixel circuit in the pixel shown in FIG. 8 in accordance with an embodiment of the disclosure.
Figure 10:
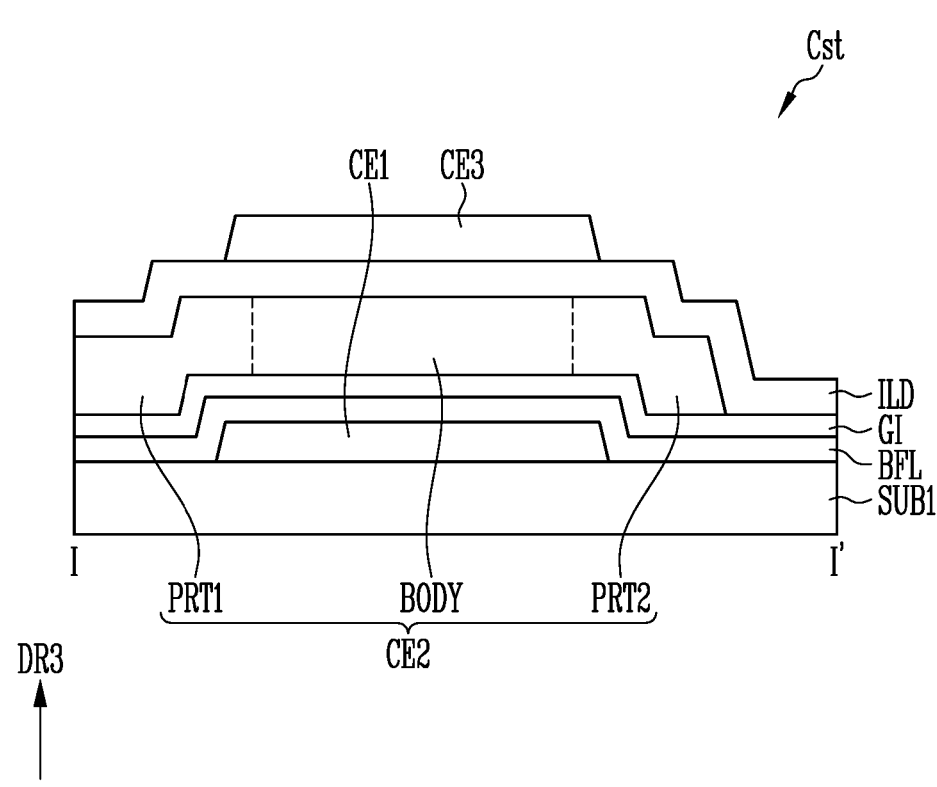
FIG. 10 is a schematic cross-sectional view illustrating a storage capacitor taken along line I-I' shown in FIG. 9A in accordance with an embodiment of the disclosure.

FIG. 8 is a layout view illustrating the pixel in the display device shown in FIG. 3 in accordance with an embodiment of the disclosure. In FIG. 8, an embodiment of the pixel PXL is illustrated based on a pixel circuit (see FIG. 4A). FIGS. 9A and 9B are each enlarged plan view of a third pixel circuit in the pixel shown in FIG. 8 in accordance with an embodiment of the disclosure. FIG. 10 is a schematic cross-sectional view illustrating the storage capacitor taken along line I-I' shown in FIG. 9A in accordance with an embodiment of the disclosure.

Referring to FIGS. 3, 8, 9A, and 10, the pixel PXL may include a first pixel circuit PXC1 for the first sub-pixel SPXL1 (see FIG. 3), a second pixel circuit PXC2 for the second sub-pixel SPXL2 (see FIG. 3), and a third pixel circuit PXC3 for the third sub-pixel SPXL3 (see FIG. 3). The first pixel circuit PXC1 may have a structure symmetrical to a structure of the third pixel circuit PXC3 in the first direction DR1, and the second pixel circuit PXC2 may have a structure substantially identical or similar to the structure of the third pixel circuit PXC3. Therefore, common components of the pixel circuits PXC1 to PXC3 (or the sub-pixels SPXL1 to SPXL3) are described based on the third pixel circuit PXC3 (or the third sub-pixel SPXL3), and overlapping descriptions will not be repeated.

Each of a first vertical power line PL1_V, a sensing line SEN, a first data line DL1, a second data line DL2, a third data line DL3, a second vertical power line PL2_V, and a first vertical scan line SL1_V may generally extend in the second direction DR2, and the first vertical power line PL1_V, the sensing line SEN, the first data line DL1, the second data line DL2, the third data line DL3, the second vertical power line PL2_V, and the first vertical scan line SL1_V may be arranged in the first direction DR1. A second vertical scan line SL2_V may correspond to the first vertical scan line SL1_V. For example, the first vertical scan line SL1_V may be a component for the pixel PXL, and the second vertical scan line SL2_V may be a component for a pixel adjacent to the pixel PXL in the first direction DR1 (or the opposite direction of the first direction DR1). Similar to the first and second vertical scan lines SL1_V and SL2_V, the first vertical power line PL1_V, the sensing line SEN, the first data line DL1, the second data line DL2, the third data line DL3, and the second vertical power line PL2_V may be repeatedly arranged in the first direction DR1 for other pixels included in the same row as the pixel PXL. The first vertical power line PL1_V, the sensing line SEN, the first data line DL1, the second data line DL2, the third data line DL3, the second vertical power line PL2_V, and the first vertical scan line SL1_V may be included in the first conductive layer described with reference to FIG. 6. For example, the first vertical power line PL1_V, the sensing line SEN, the first data line DL1, the second data line DL2, the third data line DL3, the second vertical power line PL2_V, and the first vertical scan line SL1_V may be disposed in the same layer as the bottom metal layer BML shown in FIG. 6 formed through the same process as the bottom metal layer BML.

A first horizontal power line PL1_H, a first horizontal scan line SL1_H, and a second horizontal power line PL2_H may generally extend in the first direction, and the first horizontal power line PL1_H, the first horizontal scan line SL1_H, and the second horizontal power line PL2_H may be arranged in the second direction DR2. The first horizontal power line PL1_H, the first horizontal scan line SL1_H, and the second horizontal power line PL2_H may be included in the third conductive layer described with reference to FIG. 6. For example, the first horizontal power line PL1_H, the first horizontal scan line SL1_H, and the second horizontal power line PL2_H may be disposed in the same layer as the source electrode SE and the drain electrode DE, which are shown in FIG. 6, formed through the same process as the source electrode SE and the drain electrode DE.

The first vertical scan line SL1_V and the first horizontal scan line SL1_H may constitute one scan line (e.g., the scan line SLi shown in FIG. 4A). The first vertical scan line SL1_V may be omitted according to the arrangement of a scan driver for supplying a scan signal to the scan line. The first vertical power line PL1_V and the first horizontal power line PL1_H may constitute the first power line PL1 (see FIG. 4A), and the second vertical power line PL2_V and the second horizontal power line PL2_H may constitute the second power line PL2 (see FIG. 4A). The first power line PL1 may have a mesh structure throughout the entire area of the display panel PNL (see FIG. 3) by the first vertical power line PL1_V and the first horizontal power line PL1_H. Similarly, the second power line PL2 may have a mesh structure throughout the entire area of the display panel PNL (see FIG. 3) by the second vertical power line PL2_V and the second horizontal power line PL2_H. As described with reference to FIG. 6, the first horizontal power line PL1_H may be connected to the second electrode ELT2 (see FIG. 2) through a first contact hole CNT1.

As described with reference to FIG. 6, the twenty-first connection pattern CP21 and the twenty-second connection pattern CP22 may overlap the second vertical power line PL2_V, and be connected to the second vertical power line PL2_V through a contact hole CH. Similarly, a first sub-pattern CP_S1 and a second sub-pattern CP_S2 may overlap the first vertical scan line SL1_V, and be connected to the first vertical scan line SL1_V through a contact hole CH.

The pixel circuits PXC1 to PXC3 of the pixel PXL may be located in an area (or pixel area) partitioned by at least some of the first vertical power line PL1_V, the first horizontal power line PL1_H, the second vertical power line PL2_V, and the second horizontal power line PL2_H. The first pixel circuit PXC1 may be located adjacent to the third pixel circuit PXC3 in the second direction DR2, and the second pixel circuit PXC2 may be located adjacent to the third pixel circuit PXC3 in the opposite direction of the second direction DR2.

In the third pixel circuit PXC3, a first semiconductor pattern SCP1 may extend in the first direction DR1 from the first vertical power line PL1_V. The first semiconductor pattern SCP1 may constitute a first transistor T1. An end of the first semiconductor pattern SCP1 may be connected to the first vertical power line PL1_V through a contact hole CH. Another end of the first semiconductor pattern SCP1 may overlap capacitor electrodes CE1 to CE3, and be connected to a first capacitor electrode CE1 and a third capacitor electrode CE3 through contact holes CH.

The first capacitor electrode CE1 and the third capacitor electrode CE3 may have an "L" planar shape, and have areas substantially equal or similar to each other except a protrusion part. A second capacitor electrode CE2 (or a gate electrode of the first transistor T1) may be covered by the first capacitor electrode CE1 in a plan view, except protrusion parts. For example, the second capacitor electrode CE2 may be entirely located inward by a specific distance (e.g., about 1 μm to about 2 μm) from an edge of the first capacitor electrode CE1 (or the third capacitor electrode CE3) in a plan view. The second capacitor electrode CE2 may overlap the first and third capacitor electrodes CE1 and CE3 in most of the area except an area in which a contact hole CH is formed. For example, the second capacitor electrode CE2 may have a "W" planar shape. However, the disclosure is not limited thereto, and the shape of the second capacitor electrode CE2 may vary according to the position of a contact hole CH adjacent to the second capacitor electrode CE2.

Referring to FIGS. 6 and 10, the first capacitor electrode CE1 may be included in the first conductive layer between the first substrate SUB1 and the buffer layer BFL, the second capacitor electrode CE2 may be included in the second conductive layer between the gate insulating layer GI and the interlayer insulating layer ILD, and the third capacitor electrode CE3 may be included in the third conductive layer on the interlayer insulating layer ILD. The first capacitor electrode CE1 and the second capacitor electrode CE2 may overlap with each other, thereby constitute a first sub-capacitor. The second capacitor electrode CE2 and the third capacitor electrode CE3 may overlap with each other, thereby constitute a second sub-capacitor. As shown in FIGS. 8 and 9A, the third capacitor electrode CE3 may be connected to the first capacitor electrode CE1 through a contact hole CH (i.e., a contact hole CH penetrating the buffer layer BFL, the gate insulating layer GI, and the interlayer insulating layer ILD, which are shown in FIG. 10), and accordingly, the first sub-capacitor and the second sub-capacitor may be connected in parallel, to constitute a storage capacitor Cst. In case that the storage capacitor Cst includes the first and second sub-capacitors formed by the capacitor electrodes CE1 to CE3, a sufficient capacitance of the storage capacitor Cst may be secured, as compared with a storage capacitor including only a first sub-capacitor or a second sub-capacitor. Thus, the influence of the parasitic capacitor Cpara described with reference to FIG. 5 may be reduced or excluded.

Referring back to FIGS. 8 and 9A, an end of the second capacitor electrode CE2 may overlap a channel region of the first semiconductor pattern SCP1, and the second capacitor electrode CE2 may constitute a gate electrode of the first transistor T1. Another end of the second capacitor electrode CE2 may extend further in the second direction DR2 than the first and third capacitor electrodes CE1 and CE3 in a plan view. The another end of the second capacitor electrode CE2 may be connected to a first bridge pattern BRP1 (or a second transistor T2) through a contact hole CH. A portion of the second capacitor electrode CE2, which overlaps the first and third capacitor electrodes CE1 and CE3, may be referred to as a body part BODY, and a portion which extends from the body part BODY and protrudes further than the first and third capacitor electrodes CE1 and CE3 (or edges thereof) may be referred to as a first protrusion part PRT1 (or first protrusion pattern). The first protrusion part PRT1 may protrude toward the second transistor T2. A direction in which the first protrusion part PRT1 protrudes or extends from the body part BODY may be defined as an extending direction EDR. In the embodiment shown in FIG. 9A, the extending direction EDR may be in parallel with the second direction DR2. A first line width W1 of the first protrusion part PRT1 (i.e., a width in a direction perpendicular to the extending direction EDR) may be smaller than a width of the body part BODY (i.e., a width in the first direction DR1).

In embodiments, the second capacitor electrode CE2 may further include a second protrusion part PRT2 (or second protrusion patter) which extends from the body part BODY and protrudes further in the opposite direction of the extending direction EDR than the first and third capacitor electrodes CE1 and CE3 (or the edges thereof). The second protrusion part PRT2 may be not directly connected to components except the body part BODY. A second line width W2 of the second protrusion part PRT2 (i.e., a width in a direction perpendicular to the extending direction EDR) may be equal or similar to the first line width W1 of the first protrusion part PRT1.

In a process of forming the capacitor electrodes CE1 to CE3, an alignment error may occur between the capacitor electrodes CE1 to CE3. An alignment error may occur between the second capacitor electrode CE2 as an electrode of the storage capacitor Cst and the first and third capacitor electrodes CE1 and CE3 as another electrode of the storage capacitor Cst. For example, the second capacitor electrode CE2 may be moved by 1 μm in the second direction DR2 with respect to the first and third capacitor electrodes CE1 and CE3. An overlapping area of the first protrusion part PRT1 with respect to the first and third capacitor electrodes CE1 and CE3 may decrease or increase. On the contrary, an overlapping area of the second protrusion part PRT2 with respect to the first and third capacitor electrodes CE1 and CE3 may increase or decrease. For example, an increment/decrement of the overlapping area of the second protrusion part PRT2 may cancel a decrement/increment of the overlapping area of the first protrusion part PRT1. Thus, in spite of the alignment error between the capacitor electrodes CE1 to CE3, an overlapping area of the second capacitor electrode CE2 with respect to the first and third capacitor electrodes CE1 and CE3 may be constantly maintained, and the capacitance of the storage capacitor Cst may be constantly maintained. The pixels PXL in the display device may have storage capacitors Cst with the same capacitance or a uniform capacitance, and deterioration of display quality (e.g., a luminance variation, and mura), which is caused by a capacitance variation between the storage capacitors Cst, may be reduced or prevented.

As compared with a second capacitor electrode not including the second protrusion part PRT2, an area of the second capacitor electrode CE2 including the second protrusion part PRT2, which overlaps the first and second capacitor electrodes CE1 and CE3, may be increased, and accordingly, the capacitance of the storage capacitor Cst may be more sufficiently secured. Thus, the influence of the parasitic capacitor Cpara described with reference to FIG. 5 may be further reduced or excluded.

In an embodiment, the second protrusion part PRT2 of the second capacitor electrode CE2 may protrude by about 2 μm to about 4 μm, or about 3 μm from the body part BODY. For example, a length or margin MR of the second protrusion part PT2 may be about 2 μm to about 4 μm, or about 3 μm. For example, by considering that a process error (e.g., an alignment error between the capacitor electrodes CE1 to CE3) is about 2 μm, the second protrusion part PRT2 may protrude by about 2 μm or more from the body part BODY. In case that the capacitor electrodes CE1 to CE3, e.g., corner portions of the first and third capacitor electrodes CE1 and CE3 having a round shape, the overlapping area of the second capacitor electrode CE2 may be additionally changed even though the overlapping area of the second capacitor electrode CE2 may vary according to the arrangement position of the second protrusion part PRT2. In consideration of this, the second capacitor electrode CE2 may additionally protrude further by about 1 μm or more. In consideration of a distance between adjacent pixel circuits (e.g., the third pixel circuit PXC3 and the second pixel circuit PXC2), the second protrusion part PRT2 may protrude by about 4 μm or less from the body part BODY. However, the disclosure is not limited thereto.

In an embodiment, the first protrusion part PRT1 and the second protrusion part PRT2 may or may not be aligned in the extending direction EDR. For example, as shown in FIG. 9A, the first protrusion part PRT1 and the second protrusion part PRT2 may be not collinear with each other in the extending direction EDR. In another example, as shown in FIG. 9B, the first protrusion part PRT1 and the second protrusion part PRT2 may be collinear with each other in the extending direction EDR.

A portion of the third capacitor electrode CE3 of the third pixel circuit PXC3 may extend toward the second data line DL2, and be connected to a third bridge electrode BRE3 overlapping the second data line DL2. The third bridge electrode BRE3 may be connected to the first pixel electrode CNE1 (see FIG. 6) of the third sub-pixel SPXL3 through a first contact hole CNT1. As shown in FIG. 8, a portion of the third capacitor electrode CE3 of the first pixel circuit PXC1 may extend toward the first vertical power line PL1_V, and be connected to a first bridge electrode BRE1. The first bridge electrode BRE1 may be connected to a first pixel electrode CNE1 (see FIG. 6) of the first sub-pixel SPXL1 through a first contact hole CNT1. Similarly, a portion of the third capacitor electrode CE3 of the second pixel circuit PXC2 may extend toward the first vertical power line PL1_V, and be connected to a second bridge electrode BRE2. The second bridge electrode BRE2 may be connected to the first pixel electrode CNE1 (see FIG. 6) of the second sub-pixel SPXL2 through a first contact hole CNT1. A fourth bridge electrode BRE4 may be connected to the second vertical power line PL2_V or the second horizontal power line PL2_H, and be connected to the second pixel electrode CNE2 (see FIG. 6) through a third contact hole CNT3. The bridge electrodes BRE1 to BRE4 along with the second capacitor electrode CE2 may be included in the second conductive layer.

In the third pixel circuit PXC3, a second semiconductor pattern SCP2 may be located to be spaced apart from the first semiconductor pattern SCP1 in an oblique direction (e.g., a direction between the first direction DR1 and the second direction DR2), and extend in the first direction DR1. The second semiconductor pattern SCP2 may constitute the second transistor T2. An end of the second semiconductor pattern SCP2 may be connected to the first bridge pattern BRP1 through a contact hole CH. Another end of the second semiconductor pattern SCP2 may overlap the third data line DL3, and be connected to the third data line DL3 through a bridge pattern (e.g., a second bridge pattern BRP2).

In the third pixel circuit PXC3, a third semiconductor pattern SCP3 may be located to be spaced apart from the second semiconductor pattern SCP2 in the opposite direction of the second direction DR2, and extend in the first direction DR1. The third semiconductor pattern SCP3 may constitute a third transistor T3. An end of the third semiconductor pattern SCP3 may be connected to the first and third capacitor electrodes CE1 and CE3 through contact holes CH. Another end of the third semiconductor pattern SCP3 may overlap the sensing line SEN, and be connected to the sensing line SEN through a bridge pattern (e.g., a third bridge pattern BRP3). The bridge patterns BRP1 to BRP3 along with the third capacitor electrode CE3 may be included in the third conductive layer.

An end of a first scan connection line SL1_C may be connected to the first horizontal scan line SL1_H, extend in the second direction from the first horizontal scan line SL1_H, and overlap the second and third semiconductor patterns SCP2 and SCP3 of each of the pixel circuits PXC1 to PXC3, thereby constitutes a gate electrode of each of the second and third transistors T2 and T3.

As described above, the storage capacitor Cst may include the first and second sub-capacitors configured with the first, second, and third capacitor electrodes CE1, CE2, and CE3 overlapping with each other, and the capacitance of the storage capacitor Cst may be sufficiently secured, as compare with a storage capacitor including only a first sub-capacitor or a second sub-capacitor.

The second capacitor electrode CE2 may include the second protrusion part PRT2 protruding in the opposite direction of the extending direction EDR from the first and third capacitor electrodes CE1 and CE3, corresponding to the first protrusion part PRT1 (i.e., the first protrusion part PRT1 which protrudes in the extending direction EDR from the first and third capacitor electrodes CE1 and CE3 and is connected to the second transistor T2). In spite of the alignment error between the capacitor electrodes CE1 to CE3, the overlapping area of the second capacitor electrode CE2 with respect to the first and third capacitor electrodes CE1 and CE3 may be constantly maintained by the second protrusion part PRT2, and the capacitance of the storage capacitor Cst may be constantly maintained. Thus, a capacitance variation of the storage capacitor Cst between the pixels PXL and deterioration of display quality (e.g., a luminance variation, and mura), which is caused by the capacitance variation, may be reduced or prevented.

Further, as compared with a second capacitor electrode not including a second protrusion part PRT2, the area of the second capacitor electrode CE2 including the second protrusion part PRT2, which overlaps the first and second capacitor electrodes CE1 and CE3, may be increased, and accordingly, the capacitance of the storage capacitor Cst may be more sufficiently secured. Thus, the influence of the parasitic capacitor Cpara described with reference to FIG. 5 may be further reduced or excluded.

Figure 11:
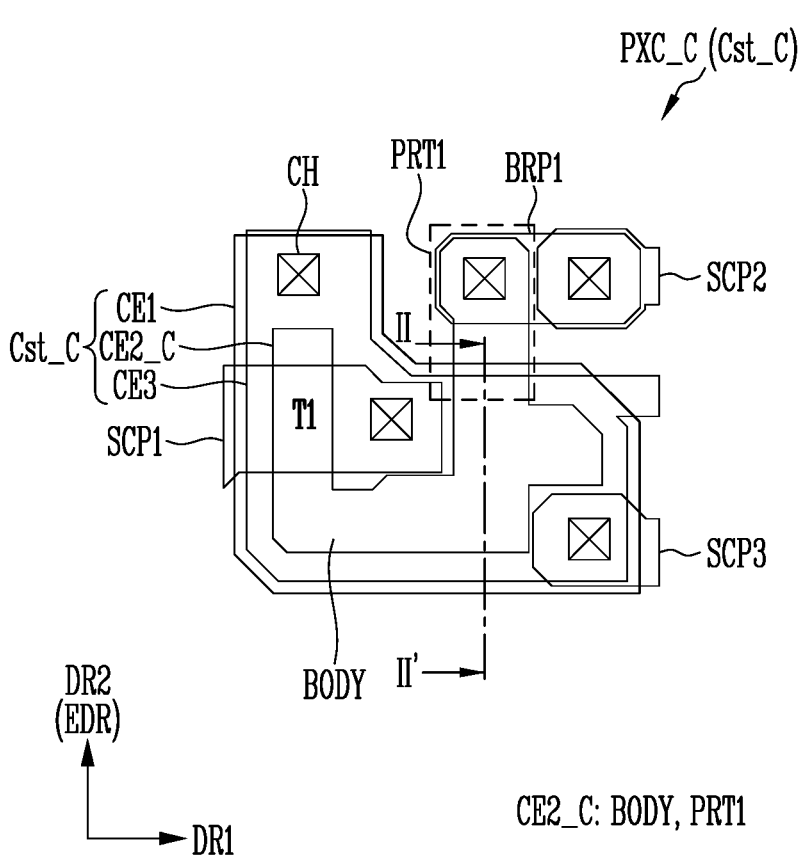
FIG. 11 is a view illustrating a pixel circuit in accordance with a comparative embodiment.
Figure 12:
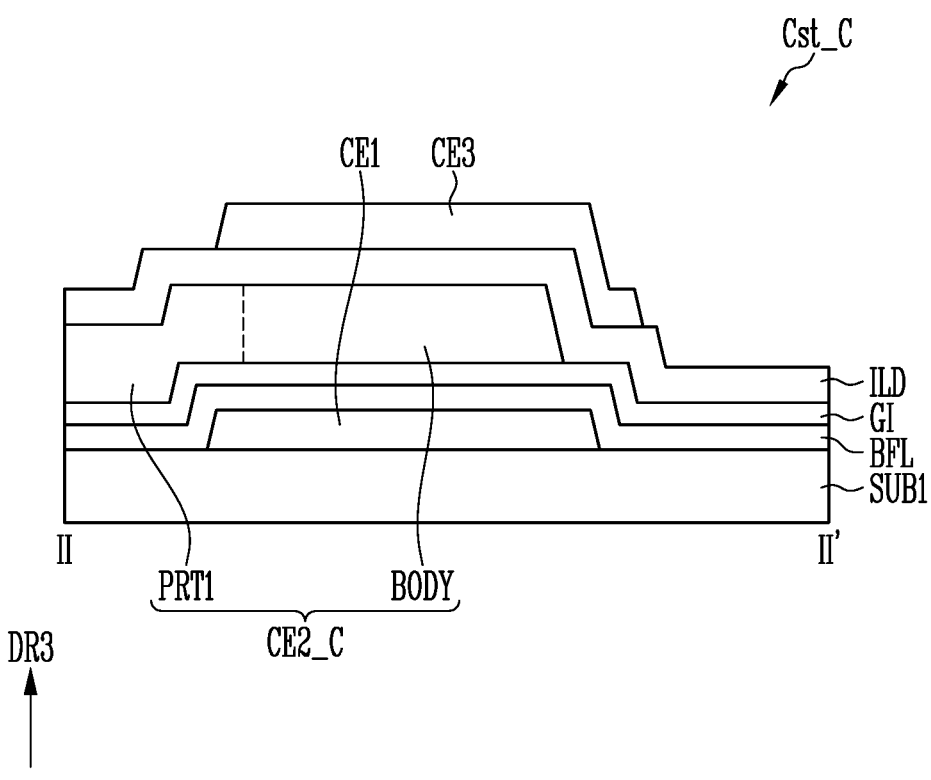
FIG. 12 is a schematic cross-sectional view illustrating a comparative embodiment of a storage capacitor taken along line II-II' shown in FIG. 11.

FIG. 11 is a view illustrating a pixel circuit in accordance with a comparative embodiment. FIG. 12 is a schematic cross-sectional view illustrating a comparative embodiment of a storage capacitor taken along line II-II' shown in FIG. 11.

Referring to FIGS. 9A, 10, 11, and 12, a pixel circuit PXC_C shown in FIG. 11 is substantially identical or similar to the third pixel circuit PXC3 shown in FIG. 9A except the second protrusion part PRT2, and therefore, overlapping descriptions will not be repeated.

A second capacitor electrode CE2_C of a storage capacitor Cst_C shown in FIGS. 11 and 12 does not include the second protrusion part PRT2 shown in FIGS. 9A and 10.

In a manufacturing process of the display device, an alignment error may occur between the second capacitor electrode CE2_C as an electrode of the storage capacitor Cst_C and the first and third capacitor electrodes CE1 and CE3 as another electrode of the storage capacitor Cst_C. For example, the second capacitor electrode CE2_C may be moved by about 1 μm in the second direction DR2 with respect to the first and third capacitor electrodes CE1 and CE3. An overlapping area of the first protrusion part PRT1 with respect to the first and third capacitor electrodes CE1 and CE3 may decrease, and the capacitance of the storage capacitor Cst_C may decrease. A capacitance change or capacitance variation of the storage capacitor Cst_C, which is caused by a process error, may cause a luminance variation between pixels.

Thus, the second capacitor electrode CE2 shown in FIGS. 8 to 10 may include the second protrusion part PRT protruding from the first and third capacitor electrodes CE1 and CE3 in the opposite direction of the extending direction EDR of the first protrusion part PRT1, and accordingly, a capacitance variation of the storage capacitor Cst and deterioration of display quality, which is caused by the capacitance variation, may be reduced or prevented.

Figure 13:
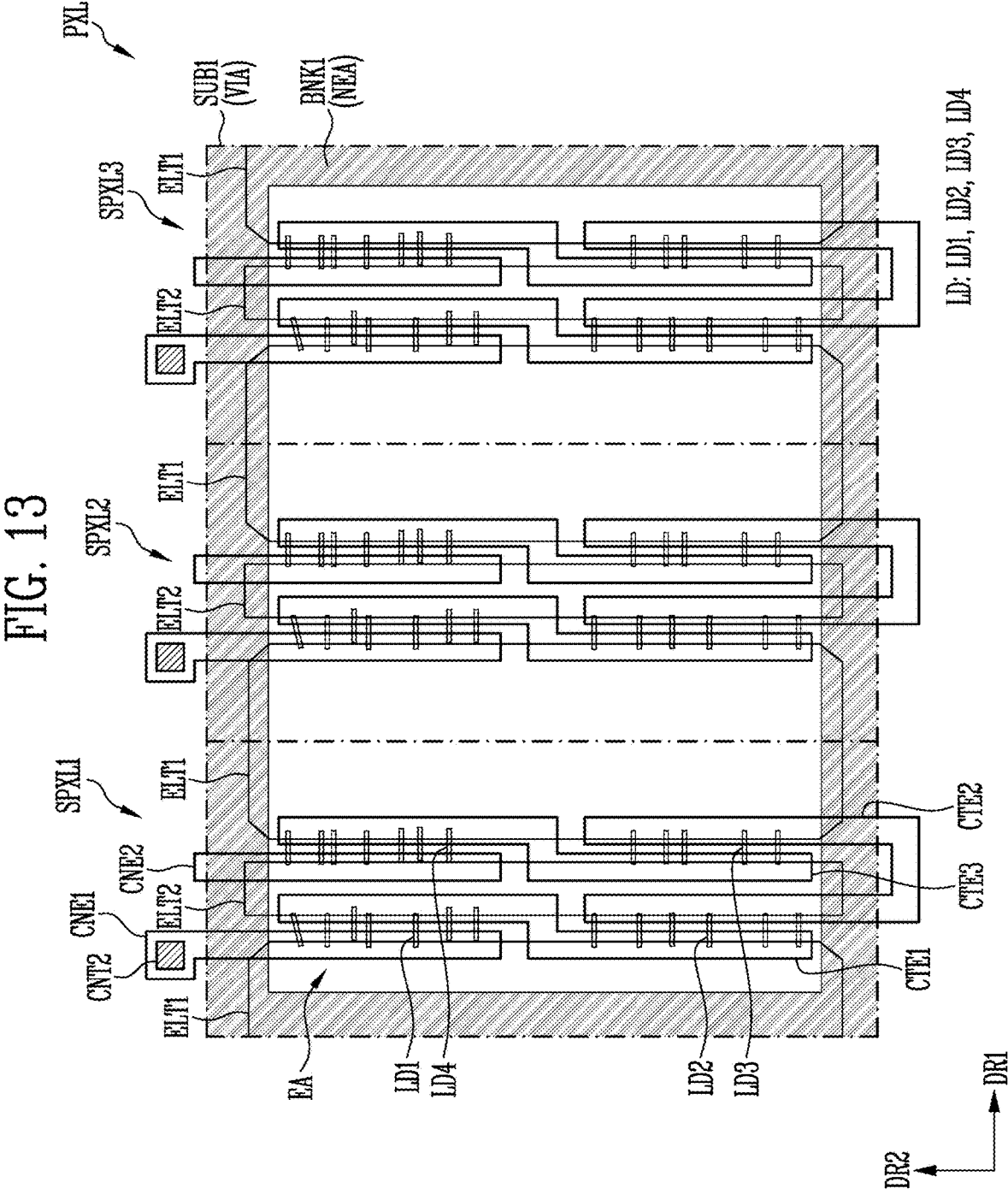
FIG. 13 is a plan view illustrating the pixel in the display device shown in FIG. 3 in accordance with an embodiment of the disclosure.

FIG. 13 is a plan view illustrating the pixel in the display device shown in FIG. 3 in accordance with an embodiment of the disclosure. In FIG. 13, a pixel PXL is briefly illustrated based on the light emitting unit EMU (see FIG. 4C).

Referring to FIGS. 3 and 13, a first sub-pixel SPXL1, a second sub-pixel SPXL2, and a third sub-pixel SPXL3 may have structures (or light emitting units EMU (see FIG. 4C)) substantially identical or similar to one another. Therefore, common components of the first sub-pixel SPXL1, the second sub-pixel SPXL2, and the third sub-pixel SPXL3 are described based on the first sub-pixel SPXL1, and overlapping descriptions will not be repeated.

The pixel PXL may be formed in a pixel area provided in a first substrate SUB1 (or a via layer VIA). The pixel area may include an emission area EA and a non-emission area NEA other than the emission area EA. The non-emission area NEA may be an area disposed adjacent to the emission area EA, and the emission area EA may be defined by a first bank BNK1. However, the disclosure is not limited thereto.

The pixel PXL may include first and second electrodes ELT1 and ELT2, a light emitting element LD, first and second pixel electrodes CNE1 and CNE2, and intermediate electrodes CTE1 to CTE3, but the disclosure is not limited thereto.

Each of the first and second electrodes ELT1 and ELT2 may extend in the second direction DR2, and the first and second electrodes ELT1 and ELT2 may be spaced apart from each other in the first direction DR1. The first and second electrodes ELT1 and ELT2 may be alternatively arranged in the first direction DR1.

The first and second electrodes ELT1 and ELT2 may be respectively separated from first and second electrodes ELT1 and ELT2 included in a pixel adjacent to the pixel PXL in the second direction DR2, but the disclosure is not limited thereto. For example, at least one of the first and second electrodes ELT1 and ELT2 of the pixel PXL may be connected to an electrode corresponding to the pixel adjacent to the pixel PXL in the second direction DR2.

The first and second electrodes ELT1 and ELT2 may be used as alignment electrodes by inputting a mixed liquid (e.g., an ink) including the light emitting element LD to the emission area EA and applying an alignment voltage. The first electrode ELT1 may become a first alignment electrode, and the second electrode ELT2 may become a second alignment electrode. The light emitting element LD may be aligned in a desired direction and/or at a desired position by an electric field formed between the first alignment electrode and the second alignment electrode.

The first and second electrodes ELT1 and ELT2 may have a bar shape extending in the second direction DR2 in a plan view, but the disclosure is not limited thereto. The shape of the first and second electrodes ELT1 and ELT2 may be variously changed.

Light emitting elements LD may be disposed between the first and second electrodes ELT1 and ELT2 such that a length L direction (see FIG. 1) of each of the light emitting elements LD is substantially parallel to the first direction DR1. For example, in the first sub-pixel SPXL1, a first light emitting element LD1 may be disposed in an upper area of a first area (or first path) between a left first electrode ELT1 and a second electrode ELT2 in a plan view, and a second light emitting element LD2 may be disposed in a lower area of the first area in a plan view. A third light emitting element LD3 may be disposed in a lower area of a second area (or second path) between the second electrode ELT2 and a right first electrode ELT1 in a plan view, and a fourth light emitting element LD4 may be disposed in an upper area of the second area in a plan view.

The first pixel electrode CNE1 may be located to overlap a first end portion of the first light emitting element LD1 and the first electrode ELT1. The first pixel electrode CNE1 may be connected to the first end portion of the first light emitting element LD1. The first pixel electrode CNE1 may constitute an anode of the light emitting unit EMU (see FIG. 4C), and be connected to the first transistor T1 (see FIGS. 4C and 8) through the second contact hole CNT2 or the like. The first pixel electrode CNE1 may be electrically separated from the first electrode ELT1. The first pixel electrode CNE1 may extend in the second direction DR2, corresponding to the first electrode ELT1.

A first intermediate electrode CTE1 may be located to overlap a second end portion of the first light emitting element LD1 and the second electrode ELT2. Also, the first intermediate electrode CTE1 may be located to overlap a first end portion of the second light emitting element LD2 and the first electrode ELT1. A portion of the first intermediate electrode CTE1 may have a bent shape. The first intermediate electrode CTE1 may physically and/or electrically connect the second end portion of the first light emitting element LD1 and the first end portion of the second light emitting element LD2 to each other.

A second intermediate electrode CTE2 may be located to overlap a second end portion of the second light emitting element LD2 and the second electrode ELT2. Also, the second intermediate electrode CTE2 may be located to overlap a first end portion of the third light emitting element LD3 and the first electrode ELT1. The second intermediate electrode CTE2 may have a shape bypassing a third intermediate electrode CTE3. The second intermediate electrode CTE2 may physically and/or electrically connect the second end portion of the second light emitting element LD2 and the first end portion of the third light emitting element LD3 to each other.

The third intermediate electrode CTE3 may be located to overlap a second end portion of the third light emitting element LD3 and the second electrode ELT2. Also, the third intermediate electrode CTE3 may be located to overlap a first end portion of the fourth light emitting element LD4 and the first electrode ELT1. A portion of the third intermediate electrode CTE3 may have a bent shape. The third intermediate electrode CTE3 may physically and/or electrically connect the second end portion of the third light emitting element LD3 and the first end portion of the fourth light emitting element LD4 to each other.

The second pixel electrode CNE2 may be located to overlap a second end portion of the fourth light emitting element LD4 and the second electrode ELT2. The second pixel electrode CNE2 may be connected to the second end portion of the fourth light emitting element LD4. The second pixel electrode CNE2 may constitute a cathode of the light emitting unit EMU (see FIG. 4C), and be connected to the second power line through the third contact hole CNT3 (see FIG. 8) or the like. Second pixel electrodes CNE2 of the sub-pixels SPXL1 to SPXL3 may be connected to each other, but the disclosure is not limited thereto. The second pixel electrode CNE2 may extend in the second direction DR2, corresponding to the second electrode ELT2.

Figure 14:
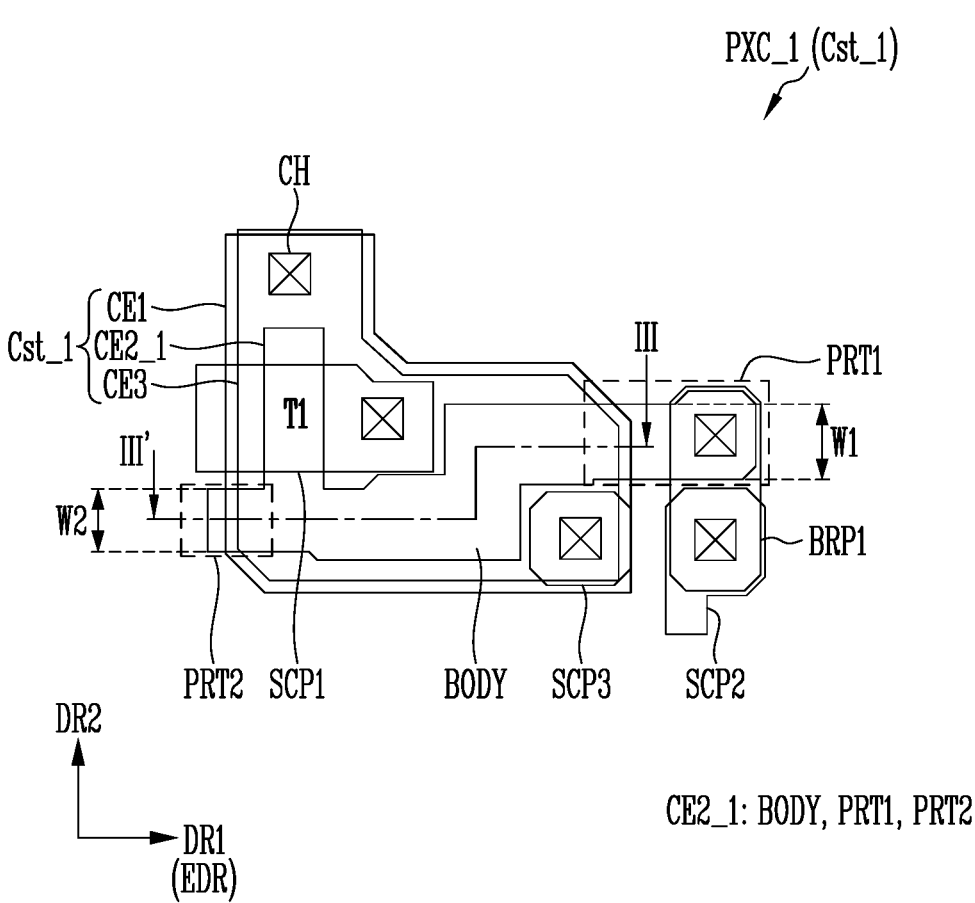
FIG. 14 is a view illustrating the pixel circuit included in the pixel shown in FIG. 8 in accordance with an embodiment of the disclosure.
Figure 15:
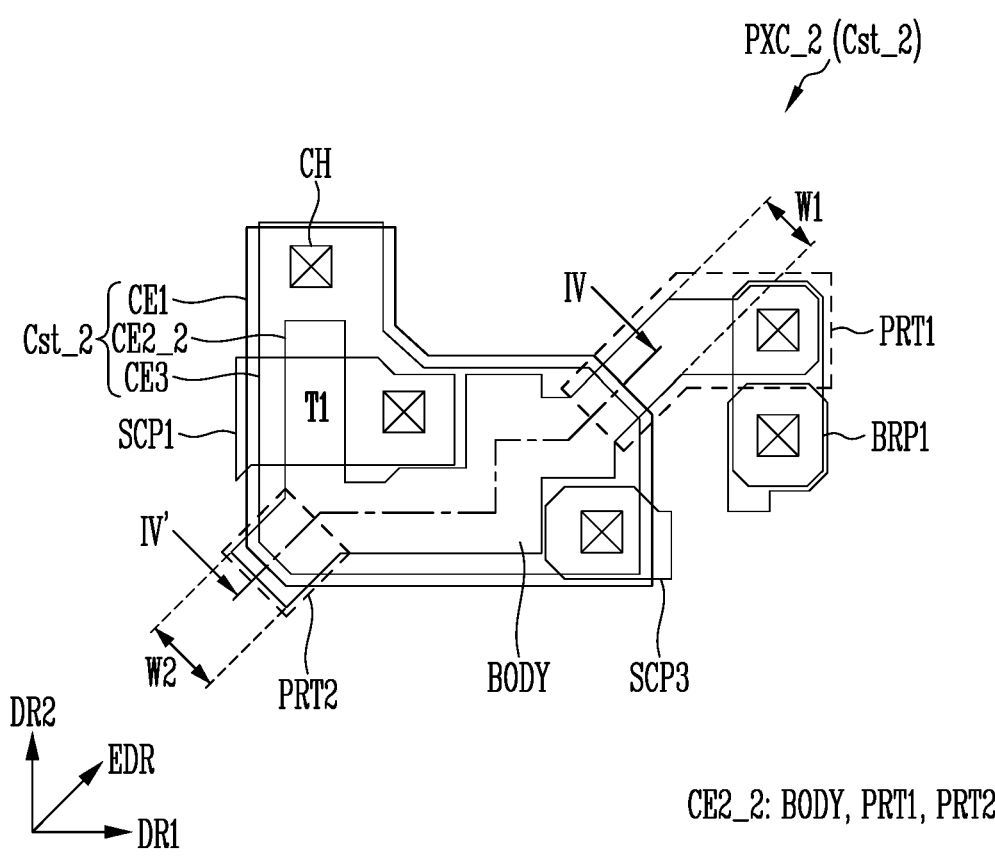
FIG. 15 is a view illustrating the pixel circuit included in the pixel shown in FIG. 8 in accordance with an embodiment of the disclosure.

FIGS. 14 and 15 are views illustrating the pixel circuit included in the pixel shown in FIG. 8 in accordance with an embodiment of the disclosure.

Referring to FIGS. 8, 9A, 14, and 15, each of a pixel circuit PXC_1 shown in FIG. 14 and a pixel circuit PXC_2 shown in FIG. 15 may be substantially identical or similar to the third pixel circuit PXC3 shown in FIG. 9A, except arrangement of the first protrusion part PRT1 and the second protrusion part PRT2. Each of a section taken along line III-III' shown in FIG. 14 and a section taken along line IV-IV' shown in FIG. 15 may be substantially identical or similar to the cross-sectional view shown in FIG. 10. Therefore, overlapping descriptions will not be repeated.

As shown in FIG. 14, a storage capacitor Cst_1 of the pixel circuit PXC_1 may include a second capacitor electrode CE2_1. A first protrusion part PRT1 of the second capacitor electrode CE2_1 may extend in the first direction DR1 from a body part BODY, and protrude further than first and third capacitor electrodes CE1 and CE3 (or edges thereof). A second protrusion part PRT2 may extend from the body part BODY, and protrude further in the opposite direction of the first direction DR1 than the first and third capacitor electrodes CE1 and CE3 (or edges thereof). For example, in the embodiment shown in FIG. 14, an extending direction EDR in which the first protrusion part PRT1 extends may be parallel to the first direction DR1.

As shown in FIG. 15, a storage capacitor Cst_2 of the pixel circuit PXC_2 may include a second capacitor electrode CE2_2. A first protrusion part PRT1 of the second capacitor electrode CE2_2 may extend in an oblique direction between the first and second directions DR1 and DR2 from a body part BODY, and protrude further than first and third capacitor electrodes CE1 and CE3 (or edges thereof). A second protrusion part PRT2 may extend from the body part BODY, and protrude further in the opposite direction of the oblique direction than the first and third capacitor electrodes CE1 and CE3 (or edges thereof). For example, in the embodiment shown in FIG. 15, an extending direction EDR may be the oblique direction.

As described above, the first protrusion part PRT1 of the second capacitor electrode CE2_1 or CE2_2 may extend or protrude in a specific direction, and the second protrusion part PRT2 of the second capacitor electrode CE2_1 or CE2_2 may extend or protrude in the opposite direction of the specific direction.

In the display device in accordance with the disclosure, a second capacitor electrode of a storage capacitor may include a first protrusion part and a second protrusion part, which protrude further than a first capacitor electrode of the storage capacitor, and the second protrusion part may protrude in a direction opposite to an extending direction of the first protrusion part. Although an alignment error between the first capacitor electrode and the second capacitor electrode occurs, a capacitance of the storage capacitor may be constantly maintained by the second protrusion part corresponding to the first protrusion part, and a capacitance variation of the storage capacitor between pixels and deterioration of display quality, which is caused by the capacitance variation, may be prevented.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a sub-pixel, wherein
the sub-pixel includes:
   a first transistor including:
      a gate electrode electrically connected to a first node;
      a first terminal electrically connected to a first power line; and
      a second terminal electrically connected to a second node;
   a light emitting part electrically connected to the second node and a second power line, the light emitting part including at least one light emitting element; and
   a capacitor formed between the first node and the second node,
   the capacitor includes:
      a first capacitor electrode;
      a second capacitor electrode overlapping the first capacitor electrode in a plan view; and
      a third capacitor electrode overlapping the second capacitor electrode in a plan view,
   an insulating layer is disposed between the first capacitor electrode and the third capacitor electrode, and
   the second capacitor electrode includes:

a first protrusion part protruding further in an extending direction than an edge of the first capacitor electrode to receive a data signal in a plan view; and
      a second protrusion part protruding in a direction opposite to the extending direction from a portion of an edge of the second capacitor electrode in a plan view,
   the first and second protrusion parts extend past outer edges of the first and third capacitor electrodes.

2. The display device of claim 1, wherein the second capacitor electrode overlaps the first capacitor electrode such that the first and second protrusion parts do not entirely overlap the first capacitor electrode in a plan view.

3. The display device of claim 2, wherein the second protrusion part is not directly connected to an external component.

4. The display device of claim 1, wherein a first width of the first protrusion part and a second width of the second protrusion part are equal in a direction perpendicular to the extending direction.

5. The display device of claim 4, wherein, regardless of an alignment error between the first capacitor electrode and the second capacitor electrode, an overlapping area between the first capacitor electrode and the second capacitor electrode in a plan view is constantly maintained by the second protrusion part corresponding to the first protrusion part.

6. The display device of claim 1, wherein the first protrusion part and the second protrusion part are not collinear with each other.

7. The display device of claim 1, wherein the first protrusion part and the second protrusion part are collinear with each other.

8. The display device of claim 1, wherein
the second capacitor electrode further includes a body part which overlaps the first capacitor electrode in a plan view,
a width of the body part is greater than a width of the second protrusion part in a direction perpendicular to the extending direction, and
the second protrusion part protrudes by about 3 $\mu$m in a direction opposite to the extending direction from the body part.

9. The display device of claim 1, wherein
the insulating layer comprises a first insulating layer and a second insulating layer,
the first capacitor electrode is located under a semiconductor pattern of the first transistor in a cross-sectional view,
the first insulating layer is disposed between the first capacitor electrode and the semiconductor pattern,
the second capacitor electrode is disposed on the semiconductor pattern in a cross-sectional view, and
the second insulating layer is disposed between the second capacitor electrode and the semiconductor pattern.

10. The display device of claim 9, wherein
the insulating layer further comprises a third insulating layer disposed between the third capacitor electrode and the second capacitor electrode.

11. The display device of claim 10, wherein the third capacitor electrode is electrically connected to the first capacitor electrode through a contact hole penetrating the first, second, and third insulating layers.

12. The display device of claim 1, wherein
the second capacitor electrode is disposed on a semiconductor pattern of the first transistor, the first capacitor electrode is disposed on the second capacitor electrode, and the insulating layer is disposed between the first capacitor electrode and the second capacitor electrode.

13. The display device of claim 1, wherein the sub-pixel further includes a second transistor electrically connected between a data line and the first node, and the first protrusion part protrudes toward the second transistor in a plan view.

14. The display device of claim 13, wherein the data line extends in the extending direction.

15. The display device of claim 13, wherein the data line extends in a direction intersecting the extending direction.

16. The display device of claim 1, wherein the light emitting part further includes:

a first electrode and a second electrode, spaced apart from each other;

a first pixel electrode disposed on the first electrode, the first pixel electrode being electrically connected to an end of the at least one light emitting element; and a second pixel electrode disposed on the second electrode, the second pixel electrode being electrically connected to another end of the at least one light emitting element, and the at least one light emitting element is disposed between the first electrode and the second electrode.

17. The display device of claim 16, wherein the first pixel electrode is electrically connected to the second terminal of the first transistor through a contact hole penetrating another insulating layer disposed below the first and second electrodes.

18. The display device of claim 16, wherein the sub-pixel further includes a color conversion layer disposed on the at least one light emitting element, the color conversion layer converting a wavelength of light incident from the at least one light emitting element and releasing the light having the converted wavelength.

19. The display device of claim 1, wherein the first power line includes:

a first vertical power line extending in a first direction; and a second vertical power line extending in a second direction parallel to the first direction, pixel circuits of a plurality of sub-pixels constituting one pixel are disposed in an area partitioned by the first vertical power line, the second vertical power line, and the second power line in a plan view, and each of the pixel circuits includes the first transistor and the capacitor.

20. The display device of claim 19, wherein the pixel circuits in the area are arranged in the first direction, and data lines for the sub-pixels extend in the first direction and are disposed adjacent to each other.

* * * * *